US012586985B2

(12) United States Patent
Garreau et al.

(10) Patent No.: US 12,586,985 B2
(45) Date of Patent: Mar. 24, 2026

(54) DISTRIBUTED FEEDBACK LASER WITH COMPLEX COUPLING

(71) Applicant: Nokia Solutions and Networks Oy, Espoo (FI)

(72) Inventors: Alexandre Garreau, Antony (FR); Jean Francois Paret, Arpajon (FR)

(73) Assignee: Nokia Solutions and Networks Oy, Espoo (FI)

( * ) Notice: Subject to any disclaimer, the term of this patent is extended or adjusted under 35 U.S.C. 154(b) by 504 days.

(21) Appl. No.: 18/185,721

(22) Filed: Mar. 17, 2023

(65) Prior Publication Data

US 2023/0307888 A1 Sep. 28, 2023

(30) Foreign Application Priority Data

Mar. 23, 2022 (EP) .................................... 22305342

(51) Int. Cl.
*H01S 5/12* (2021.01)

(52) U.S. Cl.
CPC .................................. *H01S 5/1228* (2013.01)

(58) Field of Classification Search
CPC .................................................... H01S 5/1228
See application file for complete search history.

(56) References Cited

U.S. PATENT DOCUMENTS 6,991,891 B1 1/2006 Laming et al.
7,437,029 B2 10/2008 Joyner et al.

9,246,310 B2 1/2016 Goyal et al.
10,398,005 B1 8/2019 Jankovic et al.
11,079,233 B2 8/2021 Wu et al.
11,131,619 B2 9/2021 Ozdemir et al.
2010/0020836 A1* 1/2010 Hoffman ............... H01S 5/1228
372/45.011
2020/0333530 A1 10/2020 Lin et al.
2020/0403375 A1* 12/2020 Wunderer ............. H01S 5/1234

FOREIGN PATENT DOCUMENTS

CN 113851929 A * 12/2021 ............. H01S 5/187

OTHER PUBLICATIONS

Benisty et al., Parity-time symmetric gratings in 1550 nm distributed-feedback laser diodes: insight on device design rules, Journal of the Optical Society of America B, vol. 38 No. 9 p. C168 (Sep. 2021).*
Elham Karami Keshmarzi et al., "Surface Plasmon Distributed Feedback Lasers and Parity-time Symmetric Gratings," 2016 Progress In Electronicmagnetic Research Symposium (PIERS), Shanghai, China, Aug. 8-11.

(Continued)

*Primary Examiner* — James A Menefee
(74) *Attorney, Agent, or Firm* — Harness, Dickey & Pierce, P.L.C.

(57) ABSTRACT

A distributed feedback laser (DFB) is a type of laser diode in which the active region of the device contains a periodically structured element or diffraction grating, which may include periodic changes in refractive index that cause reflection back into the laser cavity. Conventional DFB lasers used in optical networks may exploit either loss-modulated or index-modulated gratings. In the case of complex-coupling, index-modulated and loss-modulated gratings may be combined together.

15 Claims, 17 Drawing Sheets

(56)　　　　　　References Cited

OTHER PUBLICATIONS

Yeyu Zhu et al., "Modal Gain Analysis of Parity-Time-Symmetric Distributed Feedback Lasers," IEEE Journal of Selected Topics In Quantum Electronics, vol. 22, No. 5, Sep./Oct. 2016, pp. 1-7.

V. Brac de la Perriere et al., "Single Frequency Semiconductor Laser Exploiting the Concept of Parity-Time Symmetry," IEEE Explore, downloaded on Jun. 1, 2023, p. 119.

Yann G. Boucher, "Parity-Time Symmetry in Laterally Coupled Bragg Wavelengths," IEEE Journal of Quantum Electronics, vol. 55, No. 6, Dec. 2019, pp. 1-9.

Vincent Brac de la Perriere et al., "Electrically Injected Parity-time Symmetric Distributed Feedback Laser Diodes (DFB) for Telecom Applications," Nanophotonics 2021; 10(4), pp. 1309-1317.

\* cited by examiner

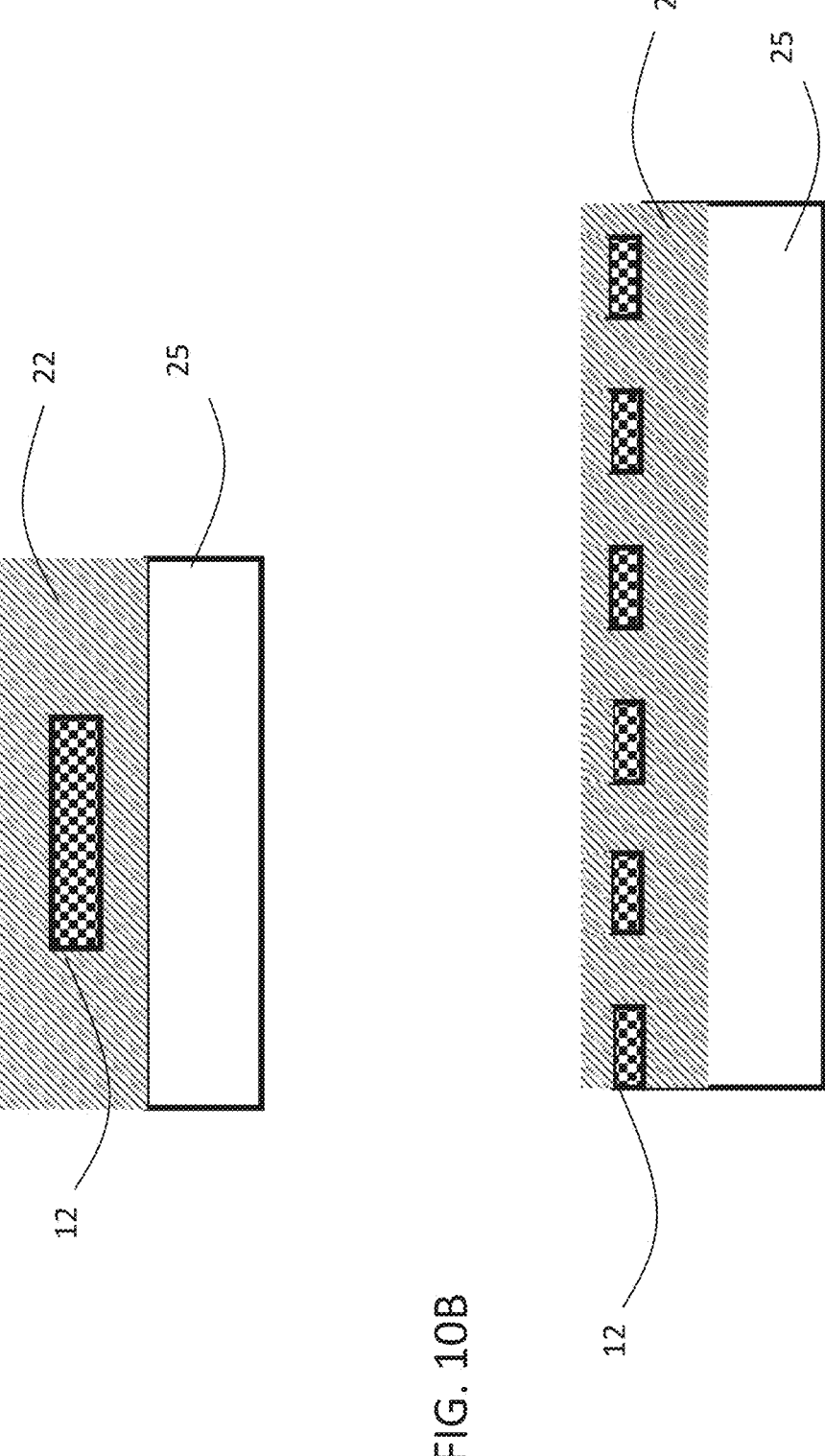

DISTRIBUTED FEEDBACK LASER WITH COMPLEX COUPLING

CROSS-REFERENCE TO RELATED APPLICATIONS

This application claims priority to and the benefit of European Patent Application No. 22305342.2 filed on Mar. 23, 2022, the entire contents of each of which are incorporated herein by reference.

TECHNICAL FIELD

Embodiments of the present disclosure relate to a distributed feedback laser, and in particular to a distributed feedback laser with complex coupling.

BACKGROUND

A distributed feedback laser (DFB) is a type of laser diode in which the active region of the device contains a periodically structured element or diffraction grating, which may include periodic changes in refractive index that cause reflection back into the laser cavity. The periodic change can be either in the real part of the refractive index, e.g. index modulated, or in the imaginary part, e.g. loss or absorption modulated. Conventional DFB lasers used in optical networks may exploit either loss coupling or index coupling mechanisms, respectively, involving a grating supporting a modulation of the material gain (loss) or a modulation of the material index of refraction.

In the case of complex-coupling, index-modulated and loss-modulated gratings may be combined together. Prior art solutions however show many drawbacks with respect to mechanical stability and process control.

An object of embodiments according to the present disclosure is to provide a more efficient distributed feedback laser with a complex-coupling grating structure.

SUMMARY

Accordingly, a first apparatus includes a distributed feedback laser comprising:

an optical waveguide gain medium configured to amplify light at a laser wavelength;

a first optical grating comprising a first plurality of index-modulated grating structures having a period $\Lambda$ disposed on one side of the optical waveguide gain medium; and a second optical grating comprising a second plurality of loss-modulated grating structures have the same period $\Lambda$, with an offset of $\Lambda/4*\Lambda/8$ from the first plurality of index-modulated grating structures, disposed on another side of the optical waveguide gain medium, opposite the first optical grating.

In embodiments the first optical grating may have a substantially zero absorption coefficient; and the second optical grating may have a non-zero absorption coefficient.

The first optical grating may be configured to work at a first order of the laser wavelength; and the second optical grating may be configured to work at the first order of the laser wavelength.

In some embodiments the first optical grating may have a photoluminescence peak wavelength larger than the laser wavelength; and the second optical grating may have a photoluminescence peak wavelength less than the laser wavelength.

The first plurality of grating structures may be in a first epitaxial film or layer of a first group III-V semiconductor; and the second plurality of grating structures may be in a second epitaxial film or layer of a second group III-V semiconductor.

The distributed feedback laser may further comprises: a first electrode; a first electrical contact region between the first electrode and the first optical grating; a first spacer region between the optical waveguide gain medium and the first optical grating; a second electrode; a second electrical contact region between the second electrode and the second optical grating; and a second spacer region between the optical waveguide gain medium and the second optical grating.

In any of the aforementioned embodiments the first electrical contact region and the first spacer region may be comprised of one of an n-doped group III-V semiconductor or a p-doped group III-V semiconductor; and the second electrical contact region and the second spacer region may be comprised of the other of the n-doped group III-V semiconductor or the p-doped group III-V semiconductor.

In any of the aforementioned embodiments $\eta_{Spacer1}$ may be $<\eta_{IndexG}$ which may be $<\eta_{wgm}$; wherein $\eta_{wgm}$ is the refractive index of the optical waveguide gain medium, $\eta_{IndexG}$ is a refractive index of the first optical grating, and $\eta_{Spacer1}$ is a refractive index of the first spacer region; and $\eta_{Spacer2}$ may be $<\eta_{wgm}$ which may be $<\eta_{LossG}$; wherein $\eta_{Spacer2}$ is a refractive index of the second spacer region, $\eta_{wgm}$ is the refractive index of the optical waveguide gain medium, and $\eta_{LossG}$ is a refractive index of the second optical grating.

In any of the aforementioned embodiments the optical waveguide gain medium may be based on separate confinement heterostructure (SCH) and multiple quantum wells (MQW).

It is clear from the aforementioned embodiments that the distributed feedback laser is a vertical, buried structure. This presents many advantages in terms of mechanical stability, and heat evacuation when fabricated using semiconductor technologies.

Accordingly, a first method includes a method of manufacturing a distributed feedback laser comprising:

a) providing a substrate;

b) providing a first optical grating over the substrate comprising a first plurality of grating structures having a period $\Lambda$;

c) providing an optical waveguide gain medium over the first optical grating configured to amplify light at a laser wavelength; and d) providing a second optical grating over the optical waveguide gain medium comprising a second plurality of index-modulated grating structures having the period $\Lambda$ with an offset of $\Lambda/4*\Lambda/8$ from the first plurality of index-modulated grating structures;

wherein the first optical grating comprises one of index-modulated grating structures or loss-modulated grating structures, and the second optical grating comprises another of the index-modulated grating structures or the loss-modulated grating structures.

Step b) may further include forming the first plurality of grating structures in a first epitaxial film or layer of a first group III-V semiconductor, and step d) may further include forming the second plurality of grating structures in a second epitaxial film or layer of a second group III-V semiconductor.

In further embodiments step b) may also comprise:

providing a first electrical contact region between the substrate and the first optical grating;

providing a first spacer region between the optical waveguide gain medium and the first optical grating;

and step d) may also comprise:

providing a second spacer region between the optical waveguide gain medium and the second optical grating;

providing a second electrical contact region on the second optical grating; and wherein the method may further comprise:

providing a first electrode on the first electrical contact region; and providing a second electrode on the second electrical contact region.

In embodiments, the first electrical contact region and the first spacer region may be comprised of one of an n-doped group III-V semiconductor or a p-doped group III-V semiconductor, and the second electrical contact region and the second spacer region may be comprised of the other of the n-doped group III-V semiconductor or the p-doped group III-V semiconductor.

In embodiments, $\eta_{Spacer1}$ may be $<\eta_{IndexG}$ which may $<\eta_{wgm}$; wherein $\eta_{Spacer1}$ is a refractive index of the first spacer region, $\eta_{wgm}$ is the refractive index of the optical waveguide gain medium, and $\eta_{IndexG}$ is a refractive index of the first optical grating; and $\eta_{Spacer2}$ may be $<\eta_{wgm}$ which may be $<\eta_{LossG}$; wherein $\eta_{Spacer2}$ is a refractive index of the second spacer region, $\eta_{wgm}$ is the refractive index of the optical waveguide gain medium, and $\eta_{LossG}$ is a refractive index of the second optical grating.

In embodiments, step b) may further comprise:

depositing the first electrical contact region on the substrate;

depositing a first grating material layer on the first electrical contact region;

depositing a first spacer material layer on the first grating material layer;

etching the first spacer material layer and the first grating material layer to form the first plurality of grating structures; and depositing additional material between the first plurality of grating structures, comprising a same material as the first electrical contact region and the first spacer layer to form the first spacer region;

whereas the step c) may further comprise:

depositing an optical waveguide gain medium material layer on the first spacer layer;

The step d) may further comprise:

depositing a second spacer material layer over the optical waveguide gain medium material layer;

depositing a second grating material layer over the second spacer material layer, depositing a second electrical contact material layer over the second grating material layer;

etching the second spacer material layer, the second grating material layer, and the second electrical contact material layer to form the second plurality of grating structures;

depositing additional material between the second plurality of grating structures, comprising a same material as the second electrical contact material layer and the second spacer material layer to form the second spacer region and the second electrical contact region; and etching at least one of the second electrical contact region, the second spacer region, the optical waveguide gain medium, and the first spacer region into a ridge waveguide.

All mentioned embodiments of the distributed feedback laser can be integrated in many other devices to be become a simple optical function. For example it can be integrated in devices such as Electro absorption-Modulated Lasers (EML), Integrated Mach-Zehnder Modulator Lasers, Master Oscillator Power Amplifiers Laser (MOPA Laser). Moreover all described embodiments can be easily integrated on different platforms such as "native" semiconductors or Silicon on isolator (SOI) as the technological process for the realization of the lasers is the same for III-V semiconductors and II-VI semiconductors.

BRIEF DESCRIPTION OF THE DRAWINGS

Some example embodiments will be described in greater detail with reference to the accompanying drawings, wherein:

FIG. 10A is a cross-sectional front view of a structure during another step of an exemplary manufacturing process of the feedback laser of FIGS. 1 and 2;

FIG. 10B is a cross-sectional side view of the structure of FIG. 10A;

5

Figure 1:
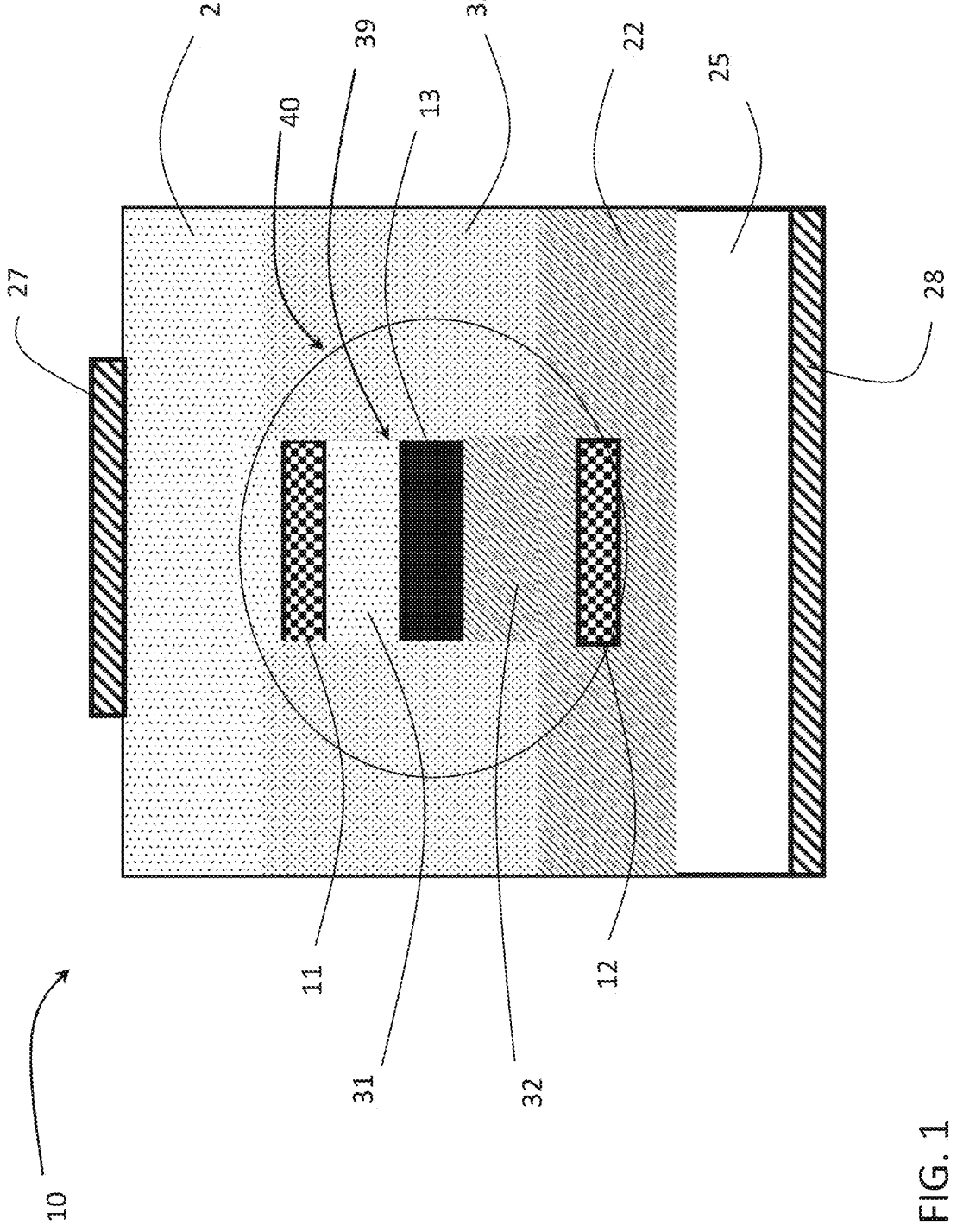
FIG. 1 is a cross-sectional front view of an exemplary distributed feedback laser.
Figure 2:
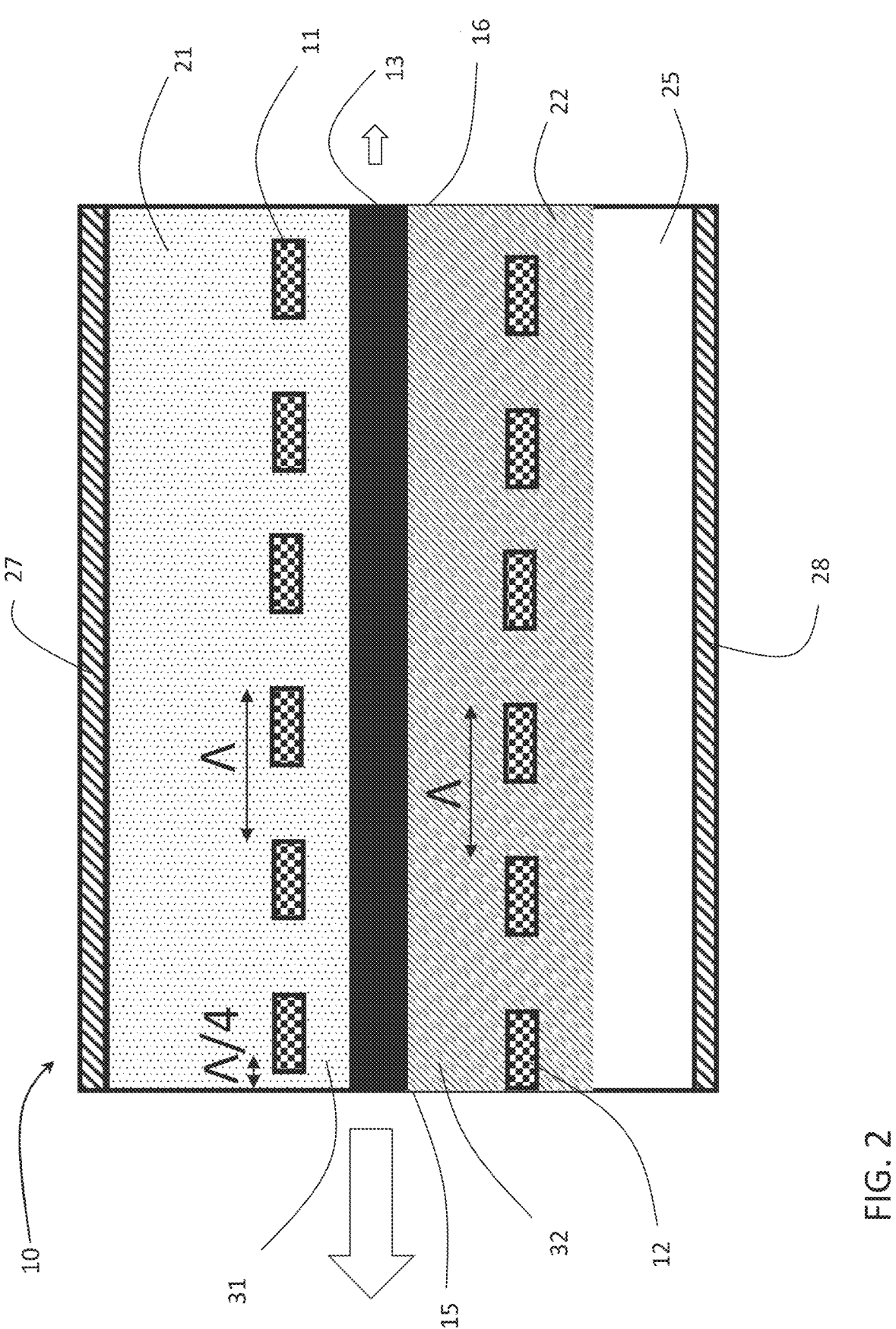
FIG. 2 is a cross-sectional side view of the distributed feedback laser of FIG. 1.
Figure 13A:
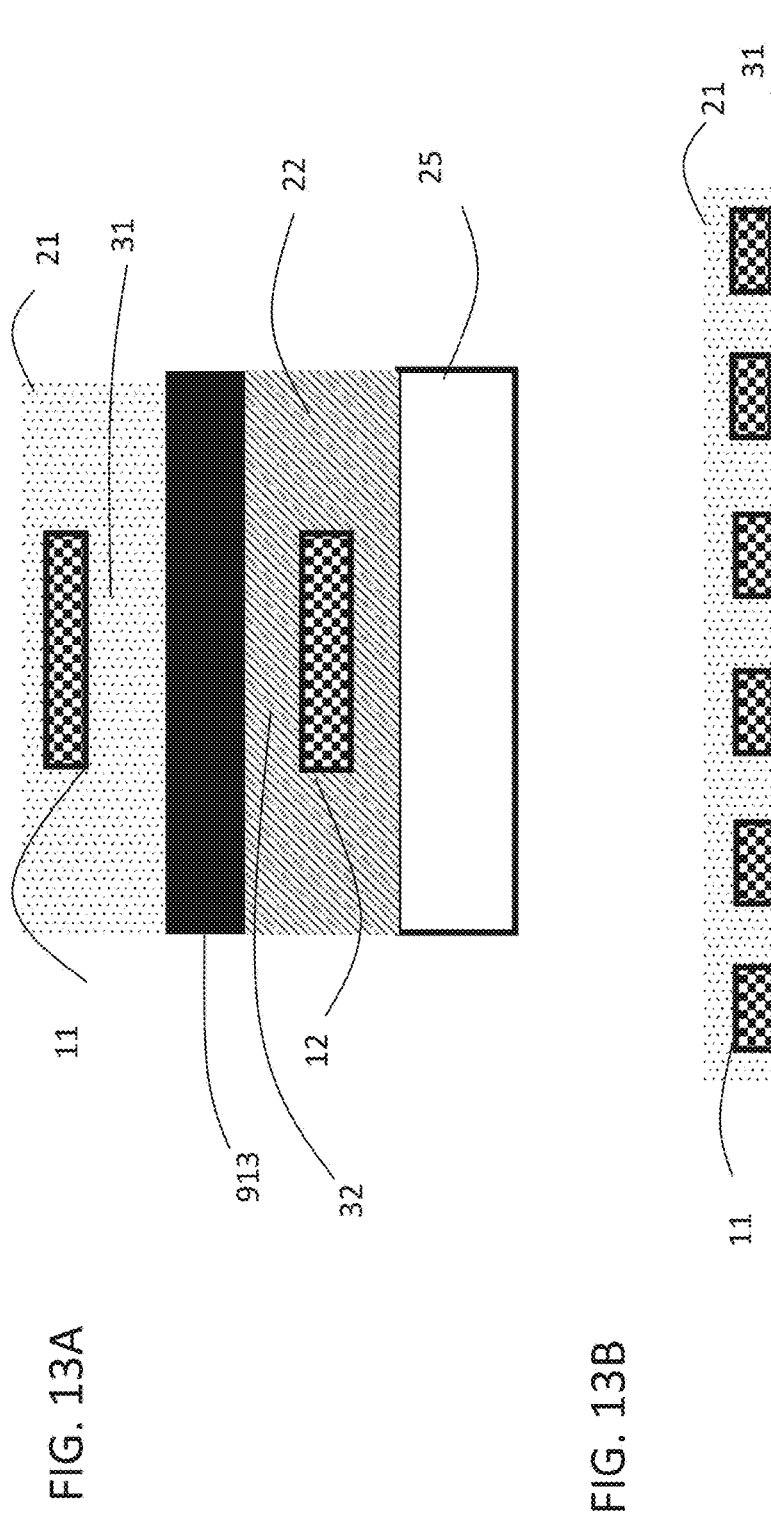
FIG. 13A is a cross-sectional front view of a structure during another step of an exemplary manufacturing process of the feedback laser of FIGS. 1 and 2.
Figure 13B:
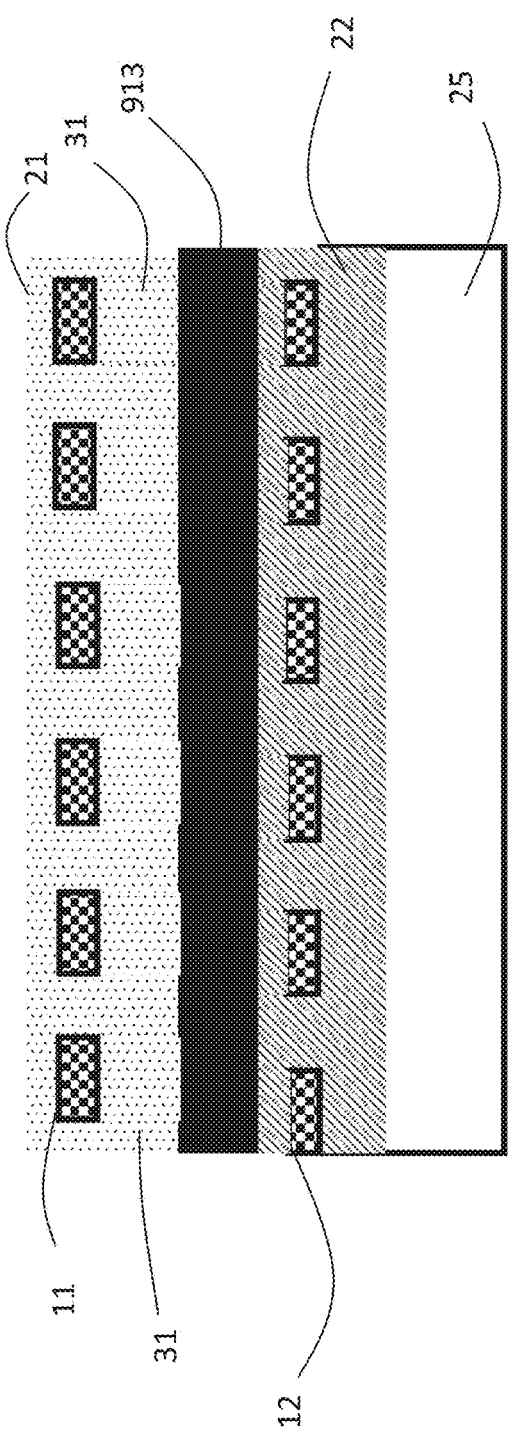
Figures 14A, 14B:
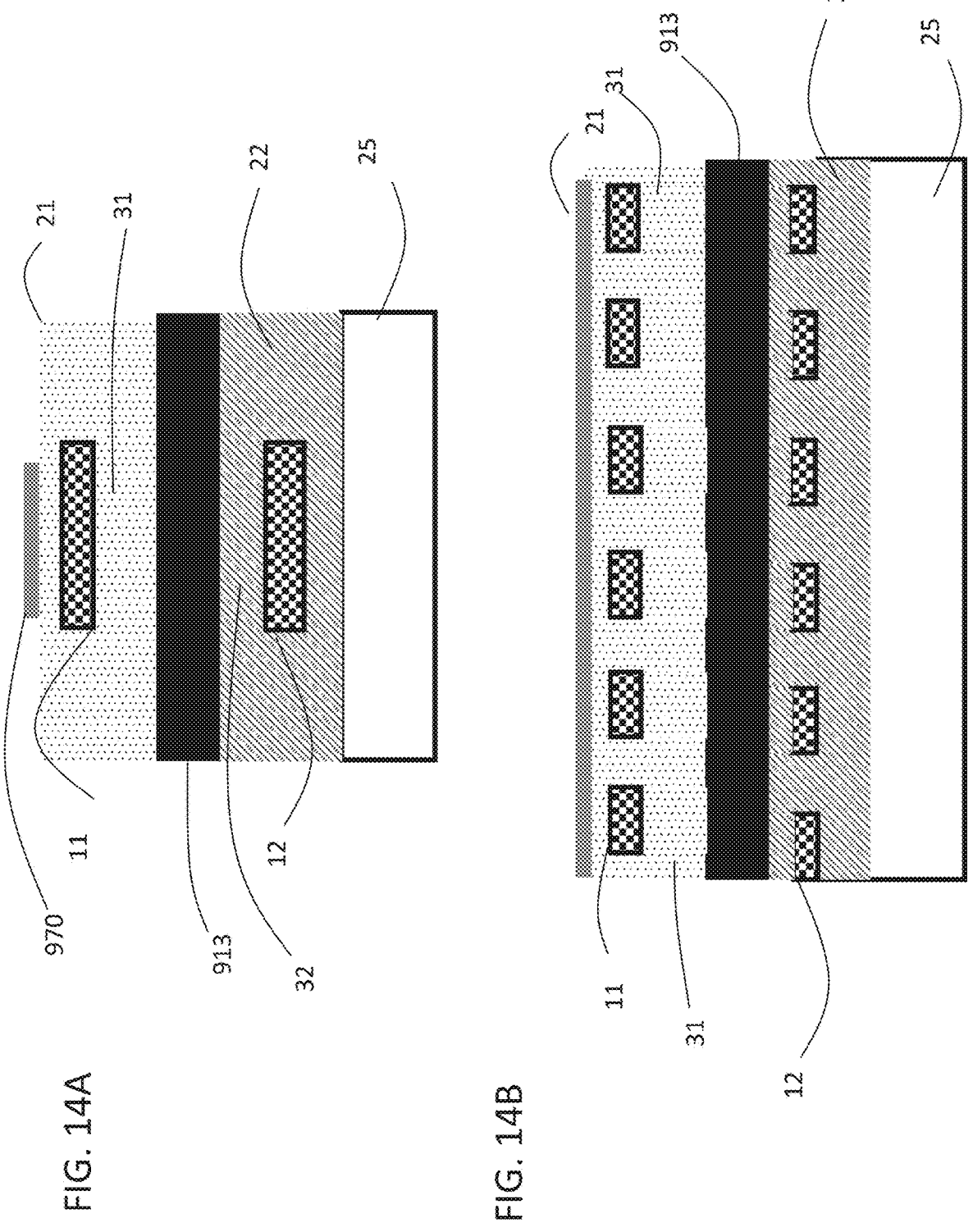
Figures 15A, 15B:
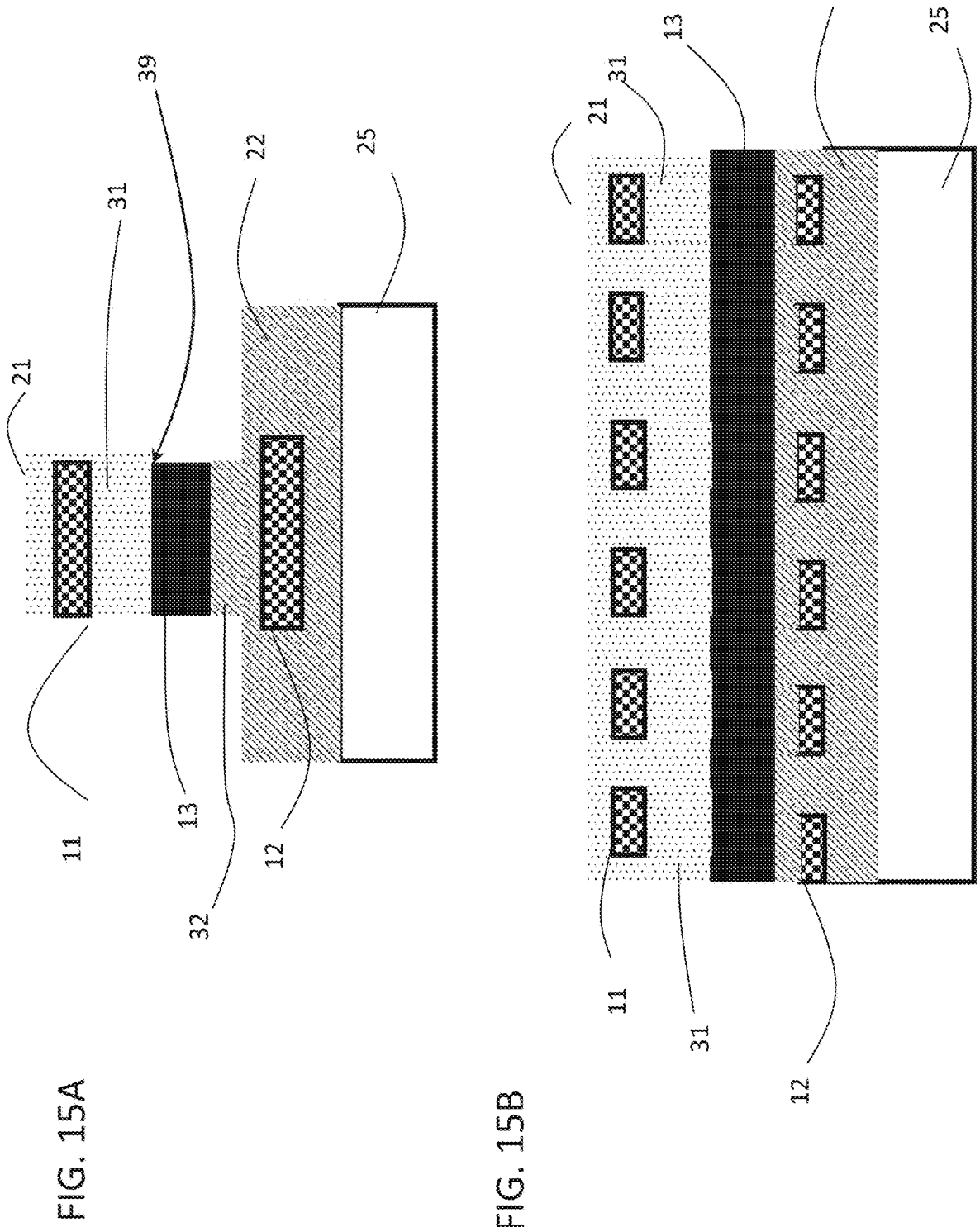
Figures 16A, 16B:
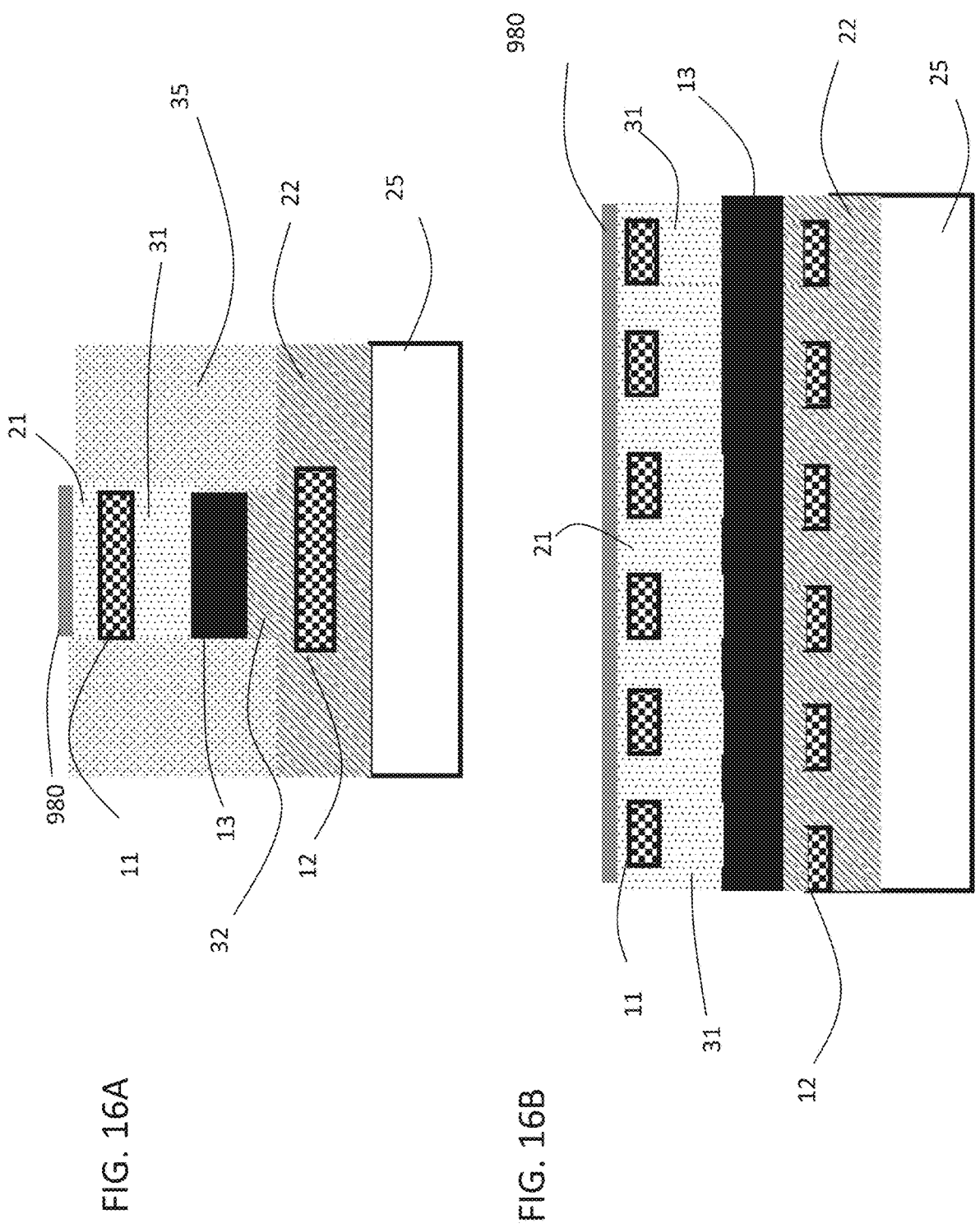
Figures 17A, 17B:
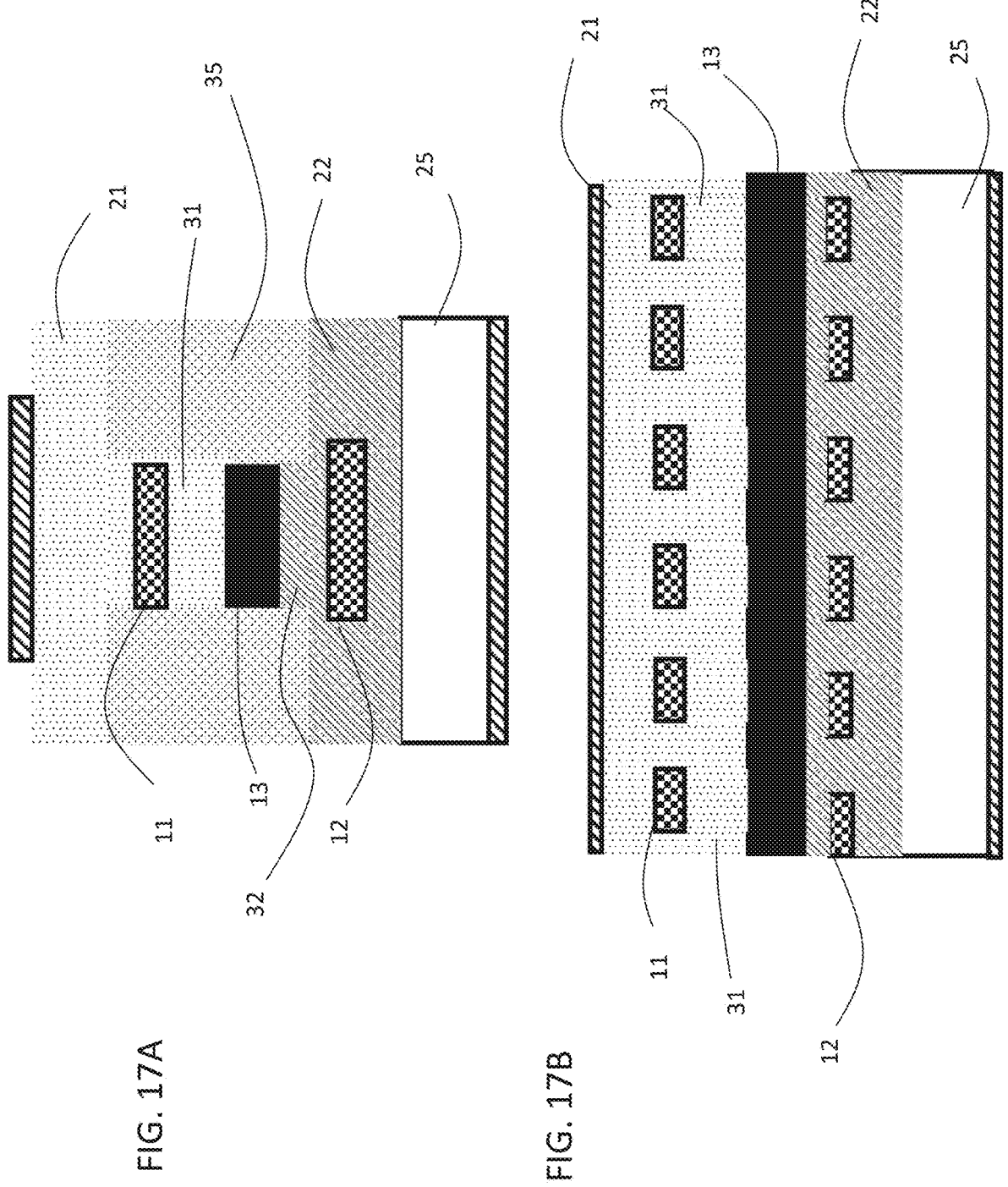

FIG. 13B is a cross-sectional side view of the structure of FIG. 13A;

FIG. 14A is a cross-sectional front view of a structure during another step of an exemplary manufacturing process of the feedback laser of FIGS. 1 and 2;

FIG. 14B is a cross-sectional side view of the structure of FIG. 14A;

FIG. 15A is a cross-sectional front view of a structure during another step of an exemplary manufacturing process of the feedback laser of FIGS. 1 and 2;

FIG. 15B is a cross-sectional side view of the structure of FIG. 15A;

FIG. 16A is a cross-sectional front view of a structure during another step of an exemplary manufacturing process of the feedback laser of FIGS. 1 and 2;

FIG. 16B is a cross-sectional side view of the structure of FIG. 16A;

FIG. 17A is a cross-sectional front view of a structure during another step of an exemplary manufacturing process of the feedback laser of FIGS. 1 and 2; and FIG. 17B is a cross-sectional side view of the structure of FIG. 17A.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Applying a complex grating structure to a DFB laser takes advantage of two features that improve the single frequency behavior of the DFB laser through the simultaneous presence of index and gain/loss modulation. In the case of complex-coupling, index-modulated and loss-modulated (parity-time) gratings are combined together. A feature of the asymmetric coupling may be obtained in gratings with elements of parity-time symmetry, by using an appropriate $\pi/2$ phase shift, i.e. for a $\Lambda/4$, between the loss modulation and the index modulation.

With reference to FIGS. 1 and 2, a DFB laser 10 may comprise two integrated buried distributed feedback (DFB) Bragg gratings, i.e. a first optical grating 11 and a second optical grating 12, which may be working at the first optical grating order. The first and second optical gratings 11 and 12 may have the same period $\Lambda$ with an offset corresponding to $\Lambda/4\pm\Lambda/8$ between each other. An optical waveguide gain medium 13 may be positioned in between the first optical grating 11 and the second optical grating 12 extending from a front face 15 to a rear face 16 configured for amplifying light at a desired laser wavelength $\lambda_{DFB}$. The optical waveguide gain medium 13 may be based on Separate Confinement Heterostructure (SCH) and Multiple Quantum Wells (MQW), such as Indium Gallium Arsenide Phosphide (In-GaAsP).

The DFB laser 10 may include an upper electrical contact region 21 over the optical waveguide gain medium 13, and a lower electrical contact region 22 under the optical waveguide gain medium 13. The upper electrical contact region 21 may be comprised of one of an n-doped or a p-doped material, such as an n-doped or p-doped group III-V semiconductor, such as n-InP or p-InP, and the lower electrical contact region 22 may be comprised the other of the n-doped or p-doped material, such as the n-doped or p-doped group III-V semiconductor, such as doped n-InP or p-InP. The first optical grating 11 may be positioned in one of the upper electrical contact region 21 or the lower electrical contact region 22, and the second optical grating 12 may be positioned in the other of the upper electrical contact region 21 or the lower electrical contact region 22. A substrate 25, adjacent to the lower electrical contact region 22, may support the various layers of the DFB laser 10. The substrate 25 may be comprised of a group III-IV semiconductor material or a group III-V semiconductor material, e.g. InP, but the use of any suitable material is possible. An upper, e.g. metal, electrode 27 may be provided at a top end of the upper electrical contact region 21, and a lower, e.g. metal, electrode 28 may be provided at a bottom end of the lower electrical contact region 22, configured to applying electrical energy, e.g. voltage or current, to the DFB laser 10.

The first (index-modulated) optical grating 11 may be defined as a transparent DFB grating, because an optical index $\eta_{IndexG}+ik_{IndexG}$ of the first optical grating 11 may be approximated only by the real number $\eta_{IndexG}$, whereby the absorption coefficient is equal to $k_{IndexG}=0$. An optical Bragg grating may be a transparent device with a periodic variation of the refractive index, so that a large reflectance (reflectivity) may be reached in some wavelength range (bandwidth) around a certain wavelength $\lambda_B$ which fulfills the Bragg condition:

$$\lambda_B = 2\eta_0\Lambda$$

where $\lambda_B$ is the Bragg wavelength of light, $\eta_0$ the effective refractive index of the optical mode, and $\Lambda$ the grating period. If this condition is met, the wavenumber of the grating matches the difference of the wavenumbers of the incident and reflected optical waves. The effective index $\eta_0$ of the optical mode is the mean of the optical indexes of materials seen by optical mode 40 based on the confinement in each of the materials. The effective index $\eta_0$ is between the lower index of the encapsulating materials of the waveguide, e.g. cladding region 35, the upper electrical contact region 21, the lower electrical contact region 22, the first optical grating 11 and the second optical grating 12, and the higher index of the waveguide, e.g. the core of the optical wave guide gain medium 13. The effective index $\eta_0$ may be close, but not the same as, the index of the core of the optical waveguide gain medium 13, because the main part of the optical mode 40 travels therethrough.

The second optical grating 12 may be defined as the loss DFB optical grating, because an optical index $n_{LossG}+ik_{LossG}$ has a non-zero absorption coefficient $k_{LossG}\neq0$.

The distributed feedback laser 10 based on the first and second buried semiconductor gratings 11 and 12 with index-loss (parity-time) symmetry provides a strong asymmetry of the output for the optical power working at the first order, whereby a majority up to substantially all the optical power of the output light may be output from the front face 15. Accordingly, an optical treatment may not be necessary on the rear face 16 of the DFB laser 10, which provides an interesting industrial simplification and consequently a cost reduction. Moreover, the threshold current intensity is smaller than usual DFB laser due to a better quantum efficiency.

The first, i.e. index-modulated, optical grating 11, which may be positioned over the optical waveguide gain medium 13, may have a photoluminescence peak wavelength below the laser wavelength $\lambda_{DFB}$. The greater the difference between the laser wavelength $\lambda_{DFB}$ and the photoluminescence peak wavelength of the semiconductor corresponding to the first optical grating 11, the more efficient is the first optical grating 11. Indeed the optical index of the first optical grating 11 $\eta_{IndexG}+ik_{IndexG}$ may be approximated by the real number $\eta_{IndexG}$ because the absorption coefficient $k_{IndexG}$ is substantially equal to 0. For a laser wavelength $\lambda_{DFB}$ of 1.55 μm, the first optical grating 11 may comprise a first plurality of grating structures comprising a group III-V semiconductor, such as aluminum gallium indium arsenide (AlGaInAs) or gallium indium arsenide phosphide (GaInAsP), which have a photoluminescence peak wavelength of 1.1 μm to 1.2 μm. The first optical grating 11 may comprise a first plurality of grating structures in a first epitaxial film or layer of the aforementioned group III-V semiconductor.

The second, i.e. loss-modulated, optical grating 12, which may be positioned under the optical waveguide gain medium 13, may have a photoluminescence peak wavelength greater than the laser wavelength $\lambda_{DFB}$. The greater the difference between the laser wavelength $\lambda_{DFB}$ and the photoluminescence peak wavelength of the semiconductor corresponding to the second grating 12, the more efficient is the second, i.e. loss, optical grating 12. Indeed the optical index of the second optical grating 12 $\eta_{LossG}+ik_{LossG}$ has a non-zero absorption coefficient $k_{LossG}\neq0$. For a laser wavelength km of 1.55 μm, the second optical grating 11 may comprise a second plurality of grating structures comprising a group III-V semiconductor, such as indium gallium arsenide (InGaAs), which has a photoluminescence peak wavelength of about 1.65 μm. The second optical grating 12 may comprise a second plurality of grating structures in a second epitaxial film or layer of the aforementioned group III-V semiconductor.

The optical waveguide gain medium 13 may be spaced apart from the first optical grating 11 by a first spacer region 31, which may be comprised of the same material as the upper electrical contact region 21, e.g. n-InP or p-InP. Optical indexes of the different layers may respect the inequation, $\eta_{Spacer1}<\eta_{IndexG}<\eta_{wgm}$, wherein $\eta_{wgm}$ is the refractive index of the optical waveguide gain medium 13, $\eta_{IndexG}$ is a refractive index of the first optical grating 11, and $\eta_{Spacer1}$ is a refractive index of the first spacer region 31. The optical waveguide gain medium 13 may be spaced apart from the second grating 12 by a second spacer region 32, which may be comprised of the same material as the second electrical contact region 22, e.g. n-InP or p-InP. Optical indexes of the different layers may respect the inequation, $\eta_{Spacer2}<\eta_{wgm}<\eta_{LossG}$, wherein $\eta_{wgm}$ is the refractive index of the optical waveguide gain medium 13, $\eta_{LossG}$ is a refractive index of the second optical grating 12, and $\eta_{Spacer2}$ is a refractive index of the second spacer region 32.

In the illustrated example of FIGS. 1 and 2, a narrow region or ridge 39 may be formed with a width narrower than the lower electrical contact region 22 and the substrate 25, that may include one or more of the optical waveguide gain medium 13, the first optical grating 11, the first spacer region 31, the second spacer region 32, and optionally a ridge portion of the upper electrical contact region 21, and a ridge portion of the lower electrical contact region 22.

The first and second gratings 11 and 12 are configured to reflect light of the first order of the desired optical wavelength $\lambda_{DFB}$ of the DFB laser 10. The period $\Lambda$ of the first, e.g. index-modulated or transparent, grating 11 is defined by the wavelength $\lambda_{DFB}$ and is the same as the period $\Lambda$ of the second, i.e. loss-modulated, optical grating 12. The period $\Lambda$ follows from the equation $\lambda_{DFB}=2\eta_0\Lambda$, where $\eta_0$ is the effective refractive index of the optical mode, as defined hereinabove. However, there may be an offset corresponding to about $\Lambda/4\pm\Lambda/8$ between the grating structures of the first and second gratings 11 and 12. If the layers of the second, i.e. loss, grating 12 and the first, i.e. transparent, grating 11 were permuted, the offset corresponding to $\Lambda/4$ will be also permuted.

The shape of the optical mode 40 in the optical waveguide gain medium 13 and surrounding cladding may be adjusted, e.g. in order to make the optical mode as circular as possible, by tuning various different dimensions of the laser elements, such as the width $W_{TransG}$ of the first grating 11, the width $W_{LossG}$ of the second grating 12, the thickness $T_{TransG}$ of the first grating 11, the thickness $T_{LossG}$ of the second grating 12, the thickness $T_{Spacer1}$ of the first spacer region 31 and the thickness $T_{Spacer2}$ of the second spacer region 32, width of the optical waveguide gain medium 13, and type of cladding around the optical waveguide gain medium 13.

In FIGS. 1 and 2, a Semi-Insulating Buried Heterostructure (SIBH) may be provided as a cladding region 35 on either side of the optical waveguide gain medium 13 and the ridge 39, between the upper electrical contact region 21 and the lower electrical contact region 22, but many other final cladding structures are possible, for example a deep ridge design (FIG. 3), a shallow ridge design (FIG. 4), a buried ridge structure (BRS) design (FIG. 5), a pn Buried Heterostructure (pnBH) design (FIG. 6), other SiBH designs (FIG. 7), as hereinafter described. An advantage of the buried SIBH structure is the possibility to obtain an optical mode as circular as possible. Furthermore a SIBH two steps process is particularly efficient for mechanical robustness as the mechanical weakness of a ridge structure is suppressed. By using such semiconductor technologies the heat produced by the photon generation in the laser 10 can be easily evacuated because of the good thermal conductivity of semiconductors making up the upper electrical contact region 21, the lower electrical contact region 22, the first spacer region 31, the second spacer region 32, and the cladding region 35. Accordingly, the thickness of the wavelength is not degraded.

Figure 3:
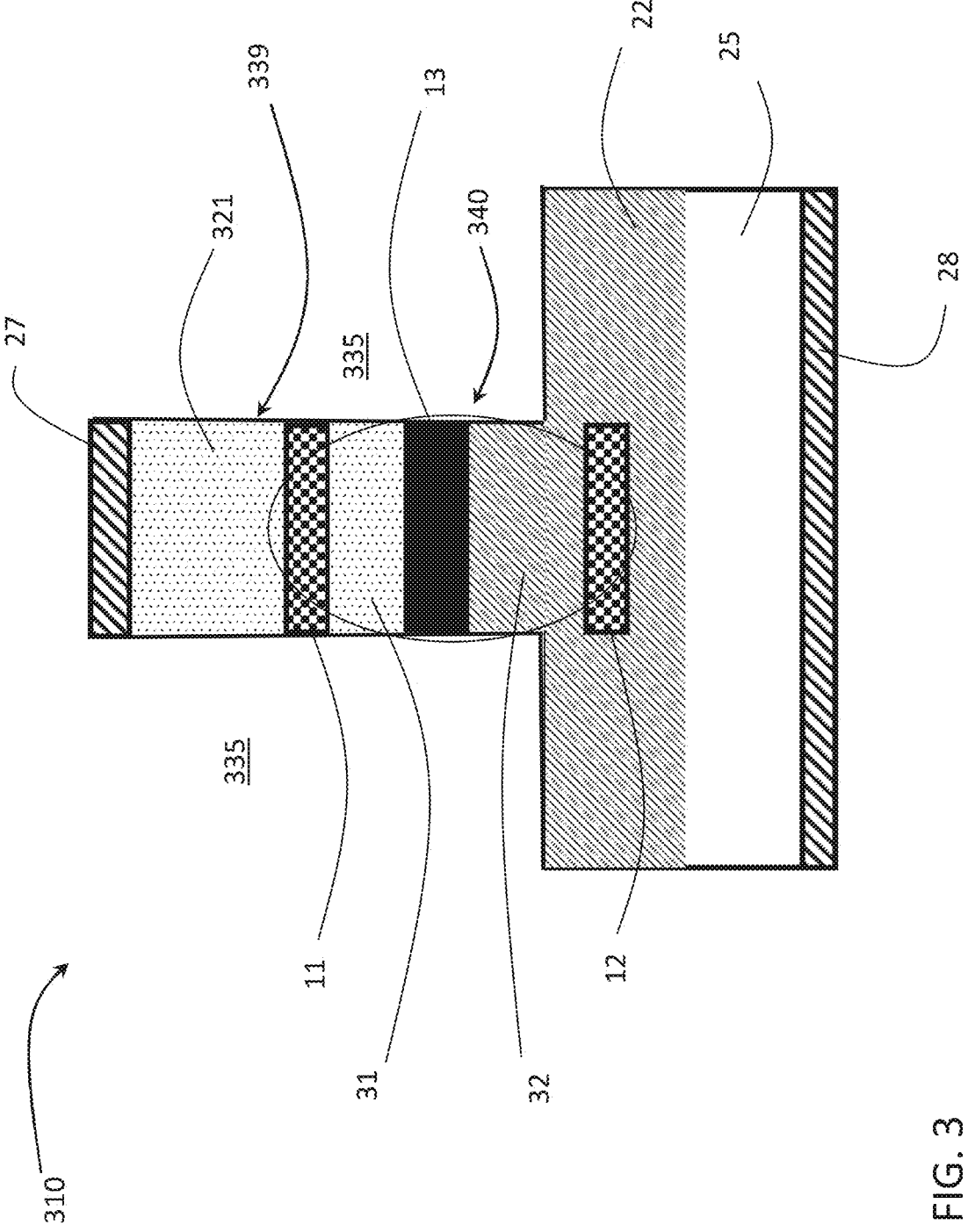
FIG. 3 is a cross-sectional front view of an exemplary distributed feedback laser with a deep ridge design.

FIG. 3 illustrates another example of a DFB laser 310 with a deep ridge design in which a ridge 339 may extend up to the upper electrode 27, and include the upper electrical contact region 321, not just the optical waveguide gain medium 13, the first spacer region 31 and the first optical grating 11, as in aforementioned example in FIGS. 2A and 2B. Air or some other suitable material may be provided as a cladding region 335 on either side of the optical waveguide gain medium 13 and the ridge 339. Accordingly, the optical mode 340 may be more oval shaped with a major axis extending between the first and second optical gratings 11 and 12, and a minor axis extending substantially the width of the optical waveguide gain medium 13, whereby a majority of the optical mode 340 may be maintained in the ridge 339.

Figure 4:
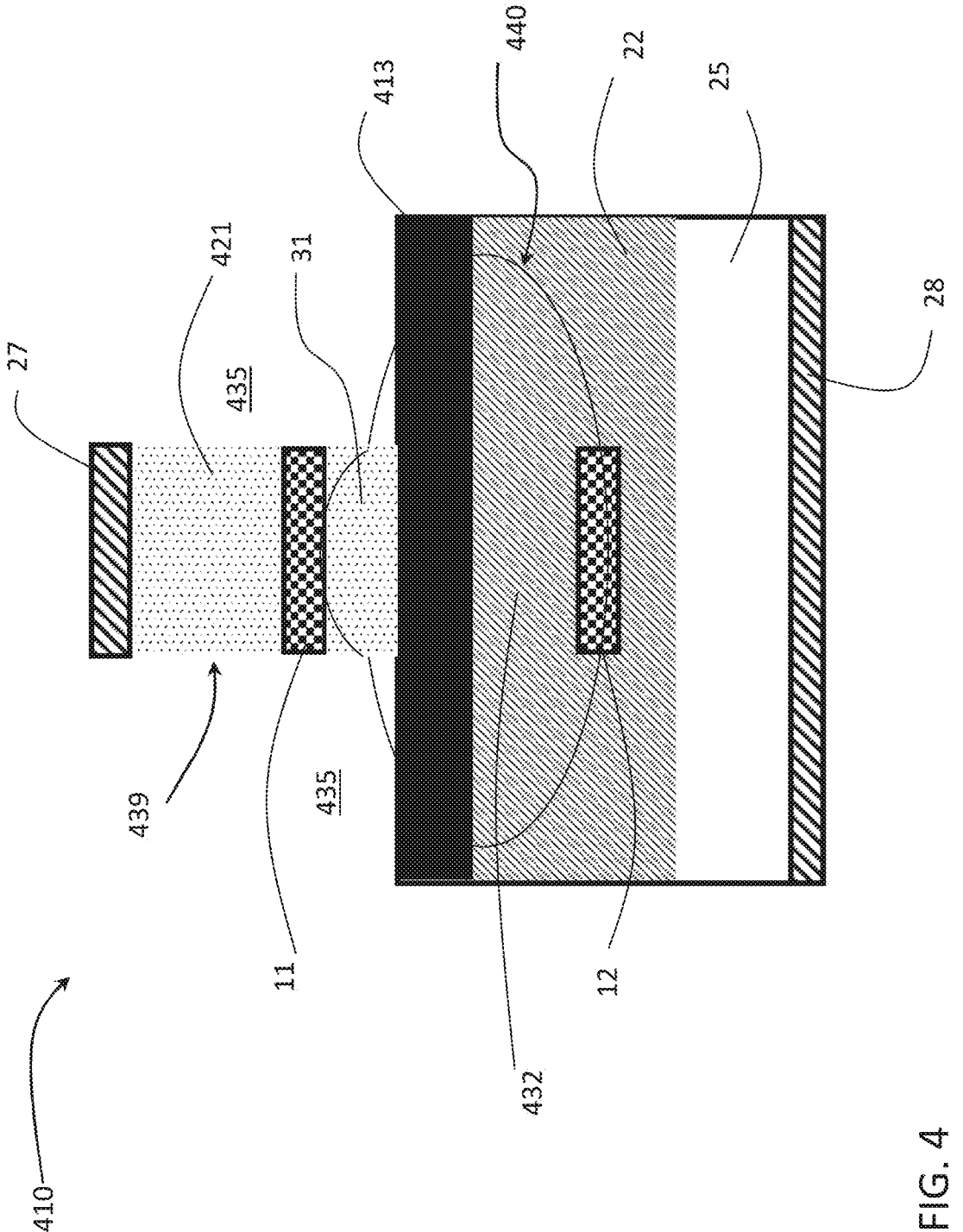
FIG. 4 a cross-sectional front view of an exemplary distributed feedback laser with a shallow ridge design.

FIG. 4 illustrates another example of a DFB laser 410 with a shallow ridge design in which a ridge 439 may extend up to the upper electrode 27 and include an upper electrical contact region 421, along with the first optical grating 11 and the first spacer region 31. However, an optical waveguide gain medium 413, and a second spacer region 432 may be wider than the ridge 439, e.g. 2×-3× as wide as the first optical grating 11 and the ridge 439. Air or some other suitable material may be provided as a cladding region 435 on either side of the optical waveguide gain medium 413 and the ridge 439. Accordingly, the optical mode 440 may be more oval shaped with a minor axis extending between the first and second optical gratings 11 and 12, and a major axis extending substantially the width of the optical waveguide gain medium 413, whereby a majority of the optical mode 440 may be maintained in the optical waveguide gain medium 413 and second spacer region 432, not in the ridge 439.

Figure 5:
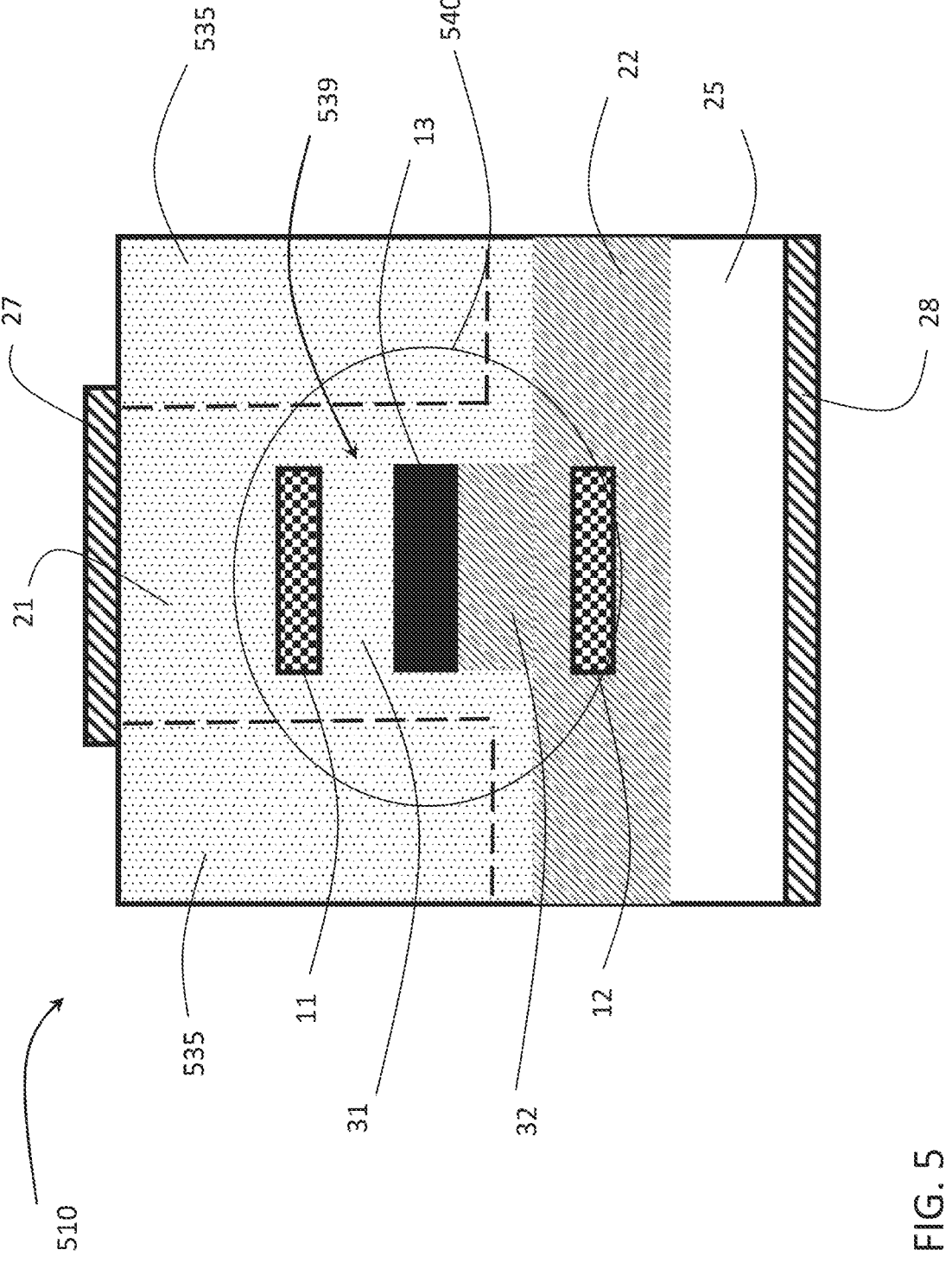
FIG. 5 a cross-sectional front view of an exemplary distributed feedback laser with a Buried Ridge Structure (BRS) design.

FIG. 5 illustrates another example of a DFB laser 510 with a Buried Ridge Structure (BRS) design in which a ridge 539 may extend up to include the first optical grating 11 and include the first spacer region 31, the optical waveguide gain medium 13, and a ridge portion of the lower contact region 22 and the second spacer region 32. The upper contact region 21 may extend up to the upper electrode 27, and on either side of the ridge 539. At both sides of the ridge 539 in the upper contact region 21, cladding regions 535 may be doped with H+ ions to provide a cladding on either side of the waveguide gain medium 13. Accordingly, the optical mode 540 may be slightly oval shaped with a minor axis extending between the first and second optical gratings 11 and 12, and a major axis extending on either side of the optical waveguide gain medium 13 into the cladding regions 535, whereby the optical mode 540 may be maintained around the optical waveguide gain medium 13 and the first and second spacer regions 31 and 32, and into the cladding regions 535.

Figure 6:
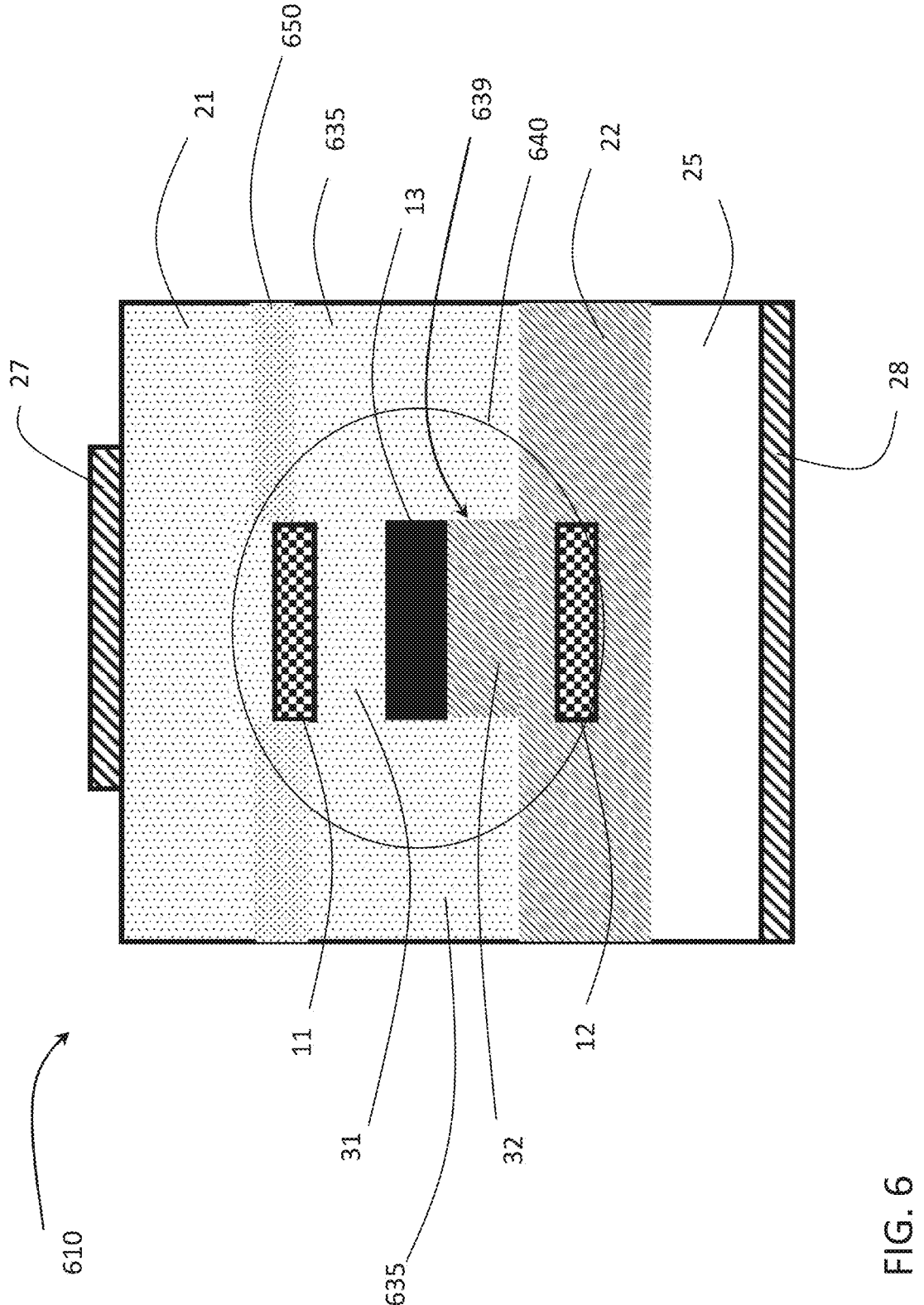
FIG. 6 is a cross-sectional front view of an exemplary distributed feedback laser with a pn Buried Heterostructure (pnBH) design.

FIG. 6 illustrates another example of a DFB laser 610 with a pn Buried Heterostructure (pnBH) design in which a ridge 639 may extend up to include the first optical grating 11 and include the first spacer region 31, the optical waveguide gain medium 13, and a ridge portion of the lower contact region 22, e.g. the second spacer region 32. The upper contact region 21 may extend up to the upper electrode 27, and on either side of the ridge 639. Both sides of the ridge 639 are comprised of the same material as in the upper contact region 21, e.g. n-InP or p-InP, to provide a cladding on either side of the optical waveguide gain medium 13. A buffer layer 650 of the same or similar material as the lower contact region 22, e.g. n-doped or p-doped material, such as the n-doped or p-doped group III-V semiconductor, may be disposed between the upper contact region 21 and the cladding regions 635 at about the same level or slightly higher than the first optical grating 11. Accordingly, the optical mode 640 may be slightly oval shaped with a minor axis extending between the first and second optical gratings 11 and 12, and a major axis extending on either side of the optical waveguide gain medium 13 into the cladding regions 635, whereby the optical mode 640 may be maintained around the optical waveguide gain medium 13 and the first and second spacer regions 31 and 32, and into the cladding regions 635.

Figure 7:
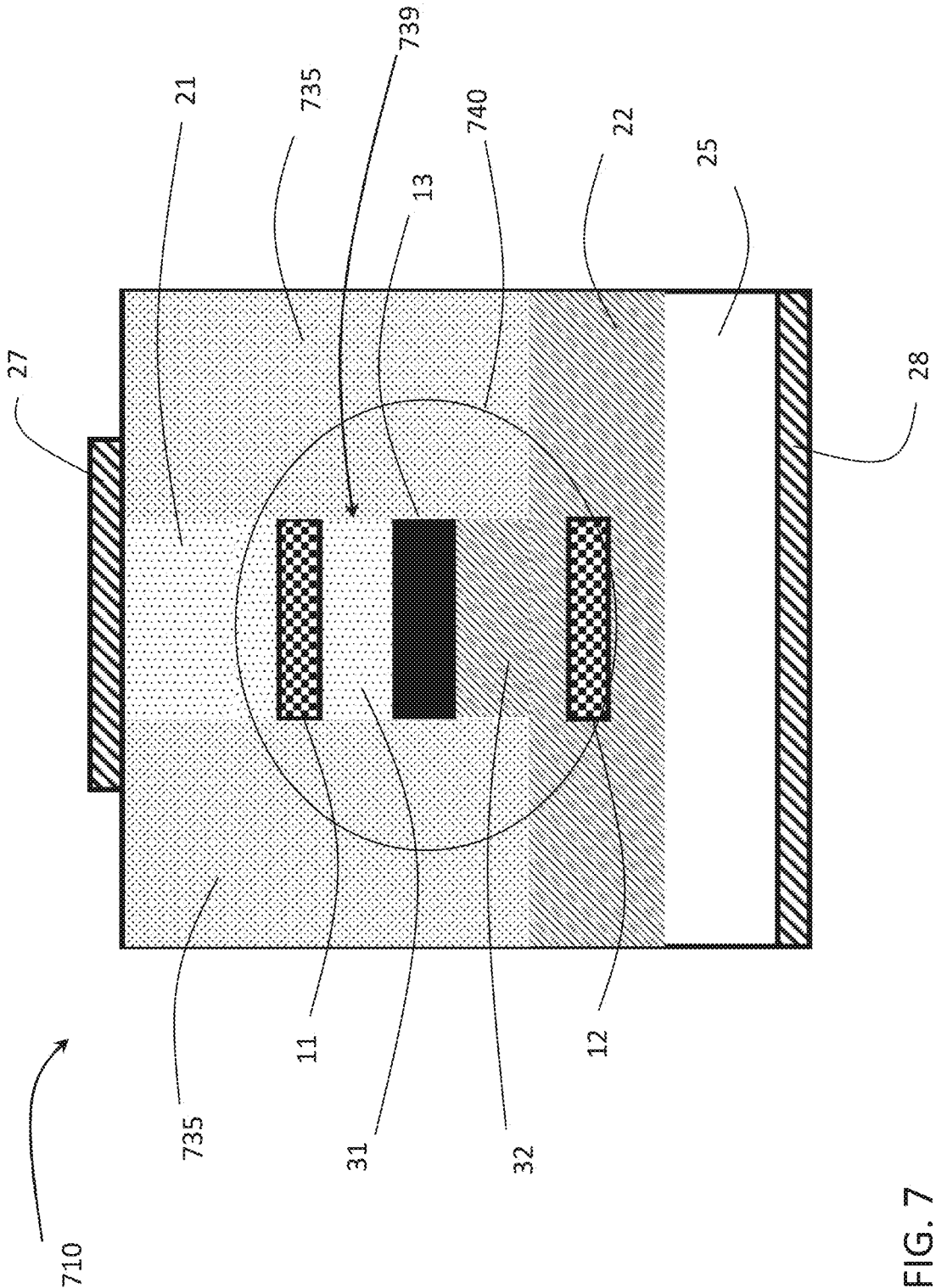
FIG. 7 is a cross-sectional front view of an exemplary distributed feedback laser with Semi Insulating Buried Heterostructure (One step SiBH) design.
Figures 8A, 8B:
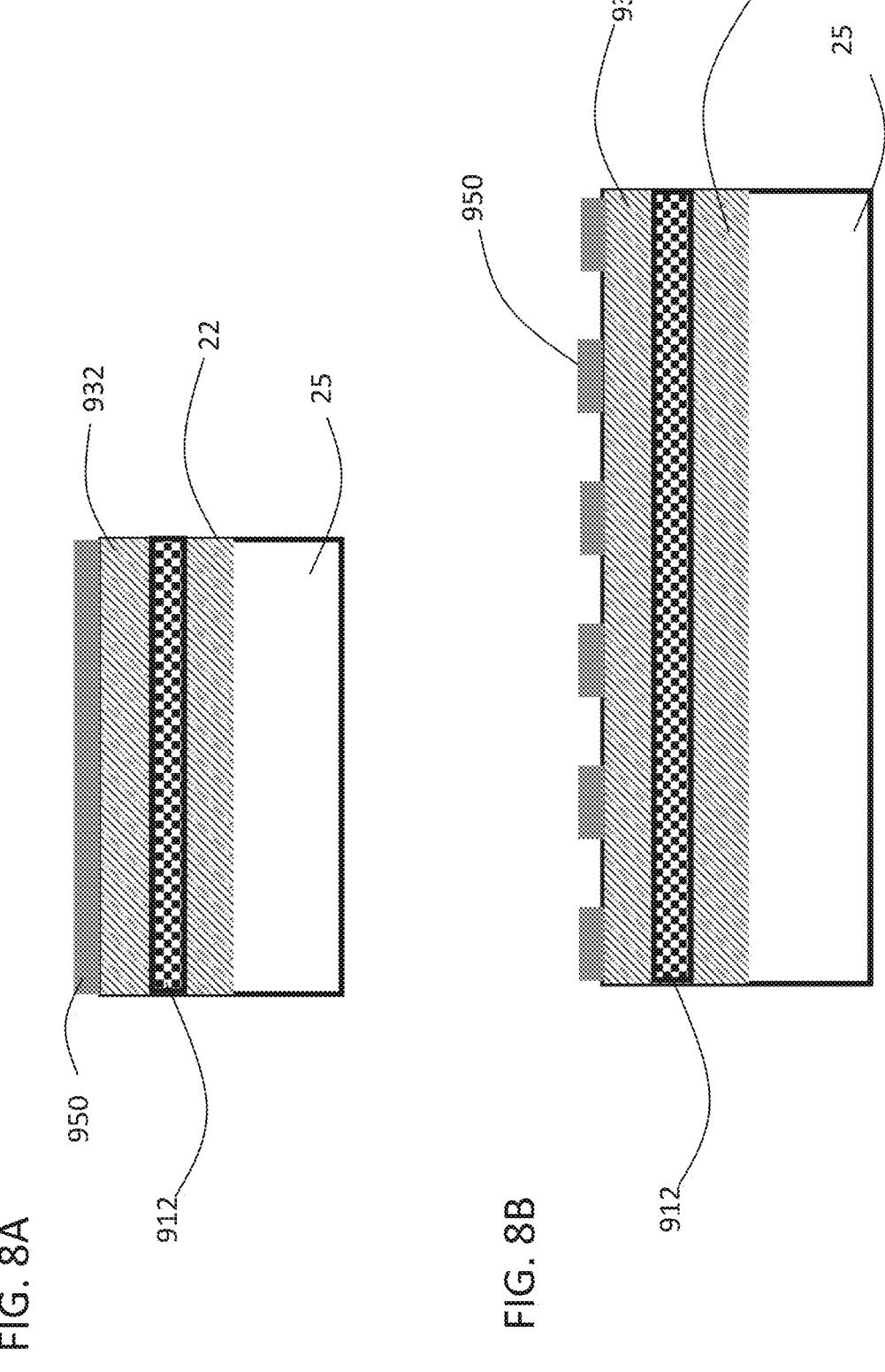
FIG. 8A is a cross-sectional front view of a structure during a first step of an exemplary manufacturing process of the feedback laser of FIGS. 1 and 2.
FIG. 8B is a cross-sectional side view of the structure of FIG. 8A.

FIG. 7 illustrates another example of a DFB laser 710 with a one-step Semi-Insulating Buried Heterostructure (One step SiBH) design, in which a ridge 739 may extend up to the upper electrode 27, and include the upper electrical contact region 21 and the optical waveguide gain medium 13, the first spacer region 31 and the first optical grating 11. A Semi-Insulating Buried Heterostructure (SIBH) may be provided as a cladding region 735 on either side of the optical waveguide gain medium 13 and the ridge 739, between the upper electrode 27 and the lower electrical contact region 22. Accordingly, the optical mode 740 may be more oval shaped with a minor axis extending between the first and second optical gratings 11 and 12, and a major axis extending on either side of the optical waveguide gain medium 13 into the cladding regions 735.

All of the upper electrical contact regions 21, 321 and 421 may comprise the same material, and may perform the same functions. All of the optical waveguides gain mediums 13, 413 may comprise the same material, and may perform the same functions. The ridges 39, 339, 439, 539, 639 and 739 may have a width 1.5 μm to 10 μm wide. The positions of the first (index-modulated) optical grating 11 and the second, i.e. loss-modulated, optical grating 12 relative to the substrate 25 may be interchangeable, whereby the first optical grating 11 may be between the substrate 25 and the optical waveguide gain medium 13.

An exemplary method of manufacture is illustrated in FIGS. 8A to 17B. The method may be shown for the DFB laser 10, but includes most if not all of the steps for manufacturing all of the aforementioned DFB lasers, except for minor additions or subtractions. In a first step illustrated in FIGS. 8A and 8B, the lower electrical contact region 22 is provided, e.g. by deposition or epitaxy, on the substrate 25, followed by providing, e.g. deposition or epitaxy, of a second grating layer 912 of the material making up the second optical grating 12, and a spacer layer 932 comprising the same material making up the lower electrical contact region 22, which may form part of the second spacer region 32.

As hereinbefore discussed, ideally the second grating layer 912, corresponding to the second e.g. loss-modulated, optical grating 12, comprises a semiconductor material with a photoluminescence peak greater than the laser wavelength $\lambda_{DFB}$. For example, when the lower contact region 22 comprises n-InP for the n-doped III-V semiconductor layer and the laser wavelength $\lambda_{DFB}$ is about 1.55 μm, the semiconductor material corresponding to the second, e.g. loss, optical grating 12 should have a photoluminescence peak wavelength greater than 1.55 μm, e.g. InGaAs, which has a photoluminescence wavelength around 1.65 μm. The greater the difference between the laser wavelength $\lambda_{DFB}$ and the photoluminescence peak wavelength of the semiconductor material corresponding to the second grating 12, the more efficient is the second grating 12.

Figures 9A, 9B:
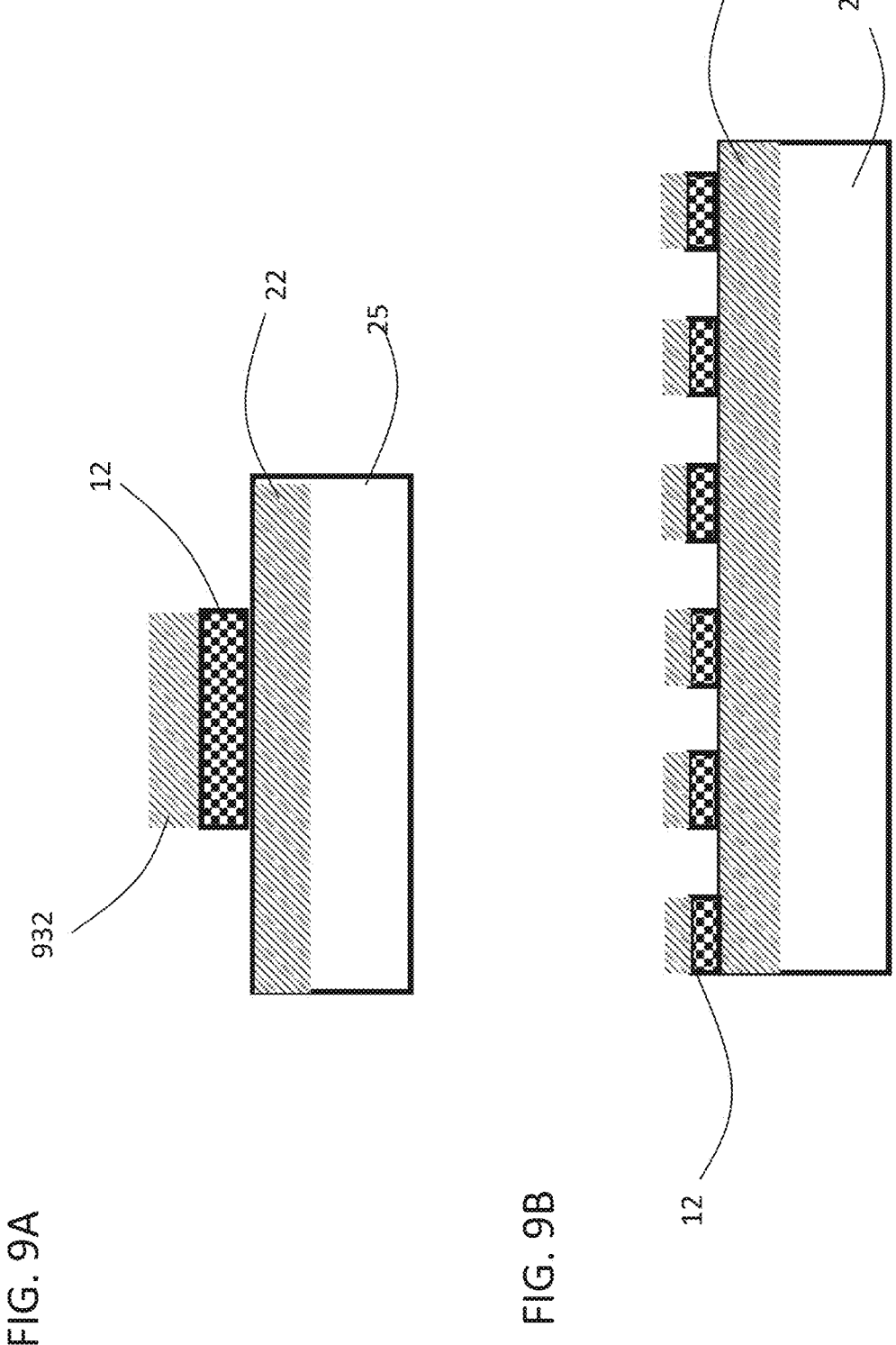
FIG. 9A is a cross-sectional front view of a structure during another step of an exemplary manufacturing process of the feedback laser of FIGS. 1 and 2.
FIG. 9B is a cross-sectional side view of the structure of FIG. 9A.

A mask layer 950, e.g. a dielectric layer such as $SiO_2$ or $Si_3N_4$, may then be deposited over the spacer layer 932, and the second grating 12 may be defined by lithography, e.g. the dielectric layer is patterned like the second optical grating 12, and becomes an etching mask. With reference to FIGS. 9A and 9B, the spacer layer 932 and the grating layer 912 may then be etched, e.g. by Reactive Ion Etching (RIE) or wet chemical solution, to form a plurality of grating structures of the second optical grating 12. What's left of the mask layer 950 may then be removed. The period Λ of the grating structures of the second optical grating 12 may be defined by the wavelength $\lambda_{DFB}$ of the DFB laser 10, 310, 410 etc. The etching rate of the second optical grating 12 may be tunable; however, it may be advantageous to avoid a lower etching rate, to avoid a too strong attraction of the optical mode by the second grating 12.

With reference to FIGS. 10A and 10B, the second grating 12 may then be buried in the lower electrical contact region 22 by depositing or epitaxial growth, the material forming the lower electrical contact region 22 between grating structures of the second optical grating 12. During this step the lower electrical contact region 22 may be flattened, e.g. with a III-V Chemical Mechanical Process.

Figures 11A, 11B:
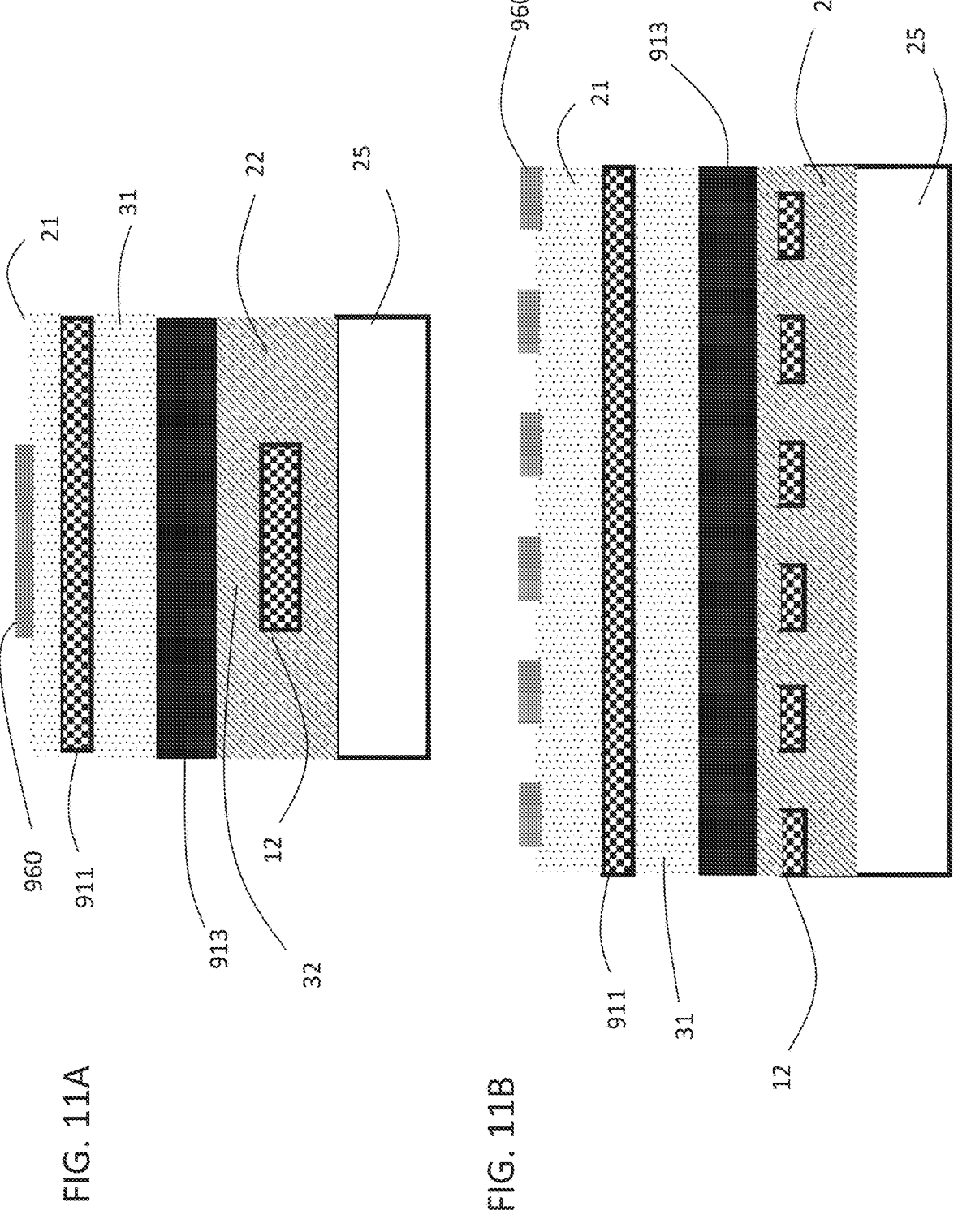
FIG. 11A is a cross-sectional front view of a structure during another step of an exemplary manufacturing process of the feedback laser of FIGS. 1 and 2.
FIG. 11B is a cross-sectional side view of the structure of FIG. 11A.
Figures 12A, 12B:
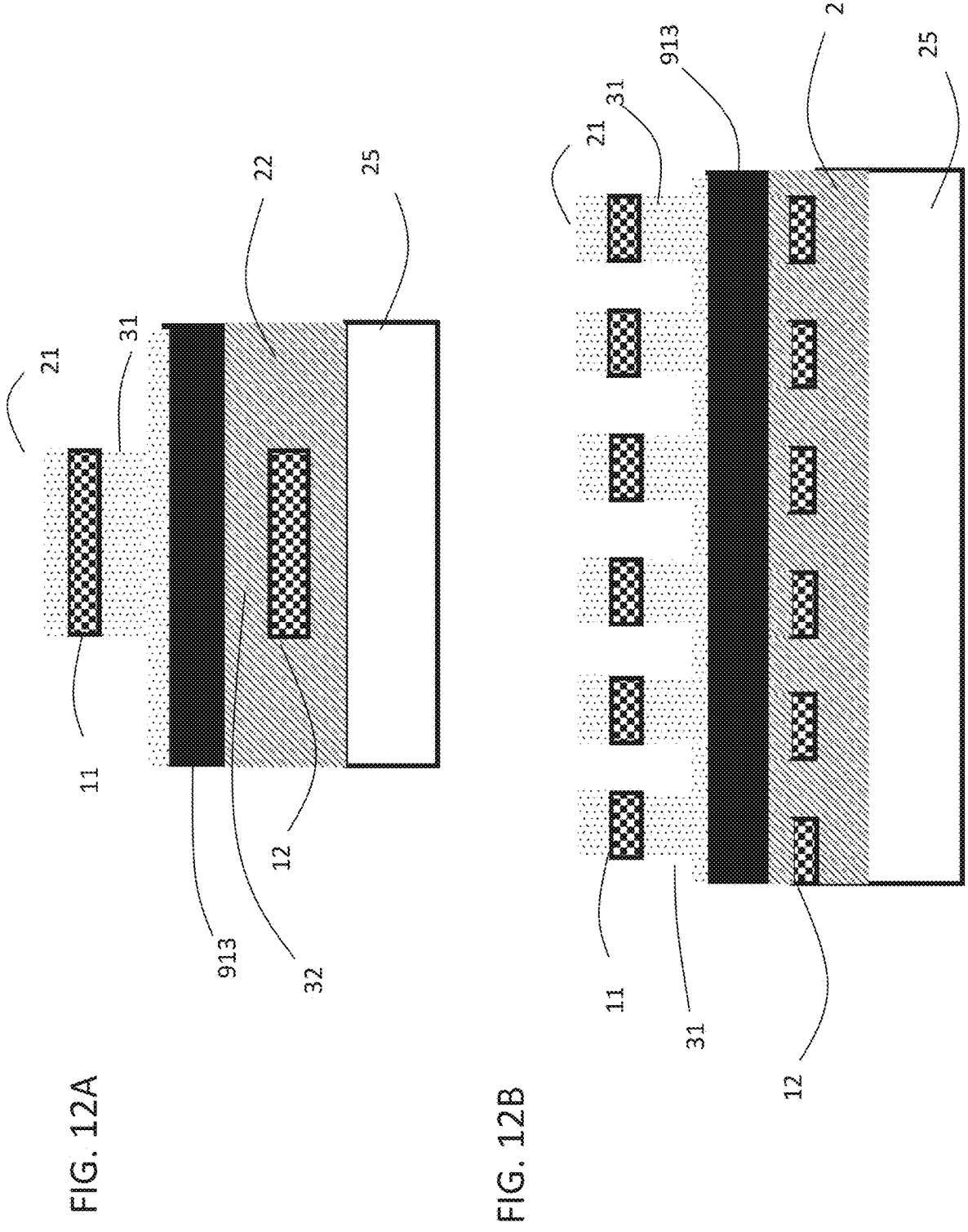
FIG. 12A is a cross-sectional front view of a structure during another step of an exemplary manufacturing process of the feedback laser of FIGS. 1 and 2.
FIG. 12B is a cross-sectional side view of the structure of FIG. 12A.

With reference to FIGS. 11A and 11B, in the next step, an optical waveguide gain medium layer 913, from which the optical waveguide gain medium 13 will be formed, is provided, e.g. deposited or epitaxy, on the lower electrical contact region 22, which will also be formed into the second spacer region 32. The optical waveguide gain medium layer 913 may be based on Separate Confinement Heterostructure and Multiple Quantum Wells, as hereinbefore disclosed, such as InGaAsP.

The first spacer region 31, which may comprise a p-doped III-V semiconductor layer, may then be provided, e.g. deposited or epitaxy, over the optical waveguide layer 913. A first grating layer 911, from which the first optical grating 11 may be formed, may then be provided, e.g. deposited or epitaxy, over the first spacer region 31. The upper electrical contact region 21, which may comprise a p-doped III-V semiconductor layer, e.g. p-InP, may then be provided, e.g. deposited or using an epitaxy process, over the first grating layer 911.

As an example, in the case of a laser wavelength $\lambda_{DFB}$ around 1.55 μm, the first spacer region 31 and the upper electrical contact region 21 may comprise a p-doped III-V semiconductor layer, such as p-doped Indium Phosphide (p-InP). Ideally, the material forming the first, e.g. index-modulated, optical grating 11, may have a photoluminescence peak wavelength less than 1.55 μm, e.g. aluminum gallium indium arsenide (AlGaInAs) or gallium indium arsenide phosphide (GaIsAsP) quaternary semiconductors with a photoluminescence peak wavelength from 1.1 μm to 1.2 μm. The greater the difference between the laser wavelength DFB and the photoluminescence peak wavelength of the material, e.g. semiconductor material, corresponding to the first, e.g. transparent, optical grating 11, the more efficient is the first optical grating 11.

A second mask layer 960, e.g. a dielectric layer such as SiO₂ or Si₃N₄, may then be deposited on the upper electrical contact region 21 to define the first, e.g. loss, optical grating 11 by lithography. The second mask layer 960 may be patterned like the first optical grating 11 to become an etching mask. The first spacer region 31, the first grating layer 911, and the upper contact region 21 may then be etched, e.g. by reactive ion etching (RIE) or wet chemical solution, to form the first optical grating 11 and the first spacer region 31. (FIGS. 12A, 12B) What is left of the second mask layer 960 may then be removed. The period Λ of the first, e.g. transparent, optical grating 11 may be defined by the wavelength $\lambda_{DFB}$ of the DFB laser 10 and may be the same as the period Λ of the second optical grating 12. However, there may an offset corresponding to Λ/4±Λ/8 between the grating structures in the first optical grating 11 and the second optical grating 12. The etching rate of the first, e.g. transparent, optical grating 11 may also be tunable; however, it may be advantageous to avoid a small etching rate, to avoid a too strong attraction of the optical mode by the first optical grating 11. There may be a balance between the first and second optical gratings 11 and 12 to keep the circularity of the optical mode of the DFB laser 10.

With reference to FIGS. 13A and 13B, the first optical grating 11 may then be buried in the first electrical contact region 21, e.g. by provision, such as an epitaxial growth, of the material forming the first electrical contact region 21 and the first spacer region 31. For example in case of a laser wavelength around 1.55 μm, the first electrical contact region 21 and the first spacer region 31 may be a p-doped III-V semiconductor layer, such as p-InP.

With reference to FIGS. 14A and 14B, a third masking layer 970, e.g. comprising a dielectric layer, such as SiO₂ or Si₃N₄, is deposited over the upper electrical contact region 21, and the third masking layer 970 is patterned by lithography to define the ridge 39, 339, 439 etc, which may be transferred into the third masking layer 970 by RIE.

The ridge, e.g. ridge 39, 339, 439, 539, 639 or 739, may then be etched (FIGS. 15A and 15B) by reactive ion etching (RIE) or using a wet chemical solution, by etching at least one of the upper electrical contact region 21, the first spacer region 31, the optical waveguide gain medium 13, and the second spacer region 32 into the ridge waveguide. Many technologies like deep ridge, shallow ridge, BRS, pnBH, SiBH, as hereinbefore described, are possible. In the following steps, only SiBH technology with the deep ridge 39 is illustrated and described in detail for the DFB laser 10.

With reference to FIGS. 16A and 16B, a fourth masking layer 980 may be provided, e.g. deposited, over the ridge, e.g. ridge 39, 339, 439, 539, 639 or 739, and the cladding region, e.g. cladding regions 35, 421, 621 or 721, may be provided, e.g. deposited on either side of the ridge. In the current example, the cladding region 36 comprising a semi-insulating InP material is provided, e.g. deposited or epitaxy.

With reference to FIGS. 17A and 17B, the fourth masking layer 980 may be removed, and then the upper contact region 21, e.g. p-InP, may be completed (if not already) by providing, e.g. deposited or epitaxied, an additional layer of p-doped or n-doped material. The upper electrode 27 and the lower electrode 28 may then be provided on the upper contact region 21 and the substrate 25, respectively, e.g. by deposition.

The foregoing description of one or more example embodiments has been presented for the purposes of illustration and description. It is not intended to be exhaustive or to limit the invention to the precise form disclosed. Many modifications and variations are possible in light of the above teaching. It is intended that the scope of the disclosure be limited not by this detailed description.

We claim:

1. A distributed feedback laser comprising:
an optical waveguide gain medium configured to amplify light at a laser wavelength;
a first optical grating comprising a first plurality of index-modulated grating structures having a period Λ disposed on one side of the optical waveguide gain medium; and
a second optical grating comprising a second plurality of loss-modulated grating structures having a same period Λ, with an offset of Λ/4±Λ/8 from the first plurality of index-modulated grating structures, disposed on another side of the optical waveguide gain medium, opposite the first optical grating.

2. The distributed feedback laser according to claim 1, wherein the first optical grating has a substantially zero absorption coefficient; and wherein the second optical grating has a non-zero absorption coefficient.

3. The distributed feedback laser according to claim 1, wherein the first optical grating is configured to work at a first order of the laser wavelength; and wherein the second optical grating is configured to work at the first order of the laser wavelength.

4. The distributed feedback laser according to claim 1, wherein the first optical grating has a first photoluminescence peak wavelength larger than the laser wavelength; and wherein the second optical grating has a second photoluminescence peak wavelength less than the laser wavelength.

5. The distributed feedback laser according to claim 1, wherein first plurality of grating structures are in a first epitaxial film or layer of a first group III-V semiconductor; and wherein the second plurality of grating structures are in a second epitaxial film or layer of a second group III-V semiconductor.

6. The distributed feedback laser according to claim 1, further comprising:
a first electrode;
a first electrical contact region between the first electrode and the first optical grating;

13 a first spacer region between the optical waveguide gain medium and the first optical grating;

a second electrode;

a second electrical contact region between the second electrode and the second optical grating; and a second spacer region between the optical waveguide gain medium and the second optical grating.

7. The distributed feedback laser according to claim 6, wherein the first electrical contact region and the first spacer region are comprised of one of an n-doped group III-V semiconductor or a p-doped group III-V semiconductor; and wherein the second electrical contact region and the second spacer region are comprised of the other of the n-doped group III-V semiconductor or the p-doped group III-V semiconductor.

8. The distributed feedback laser according to claim 6, wherein $\eta_{Spacer1}<\eta_{IndexG}<\eta_{wgm}$; wherein $\eta_{wgm}$ is a refractive index of the optical waveguide gain medium, $\eta_{IndexG}$ is a refractive index of the first optical grating, and $\eta_{Spacer1}$ is a refractive index of the first spacer region; and wherein $\eta_{Spacer2}<\eta_{wgm}<\eta_{LossG}$; wherein $\eta_{Spacer2}$ is a refractive index of the second spacer region, $\eta_{wgm}$ is the refractive index of the optical waveguide gain medium, and $\eta_{LossG}$ is a refractive index of the second optical grating.

9. The distributed feedback laser according to claim 1, wherein the optical waveguide gain medium is based on separate confinement heterostructure (SCH) and multiple quantum wells (MQW).

10. A method of manufacturing a distributed feedback laser comprising:

a) providing a substrate;

b) providing a first optical grating over the substrate comprising a first plurality of grating structures having a period $\Lambda$;

c) providing an optical waveguide gain medium over the first optical grating configured to amplify light at a laser wavelength; and d) providing a second optical grating over the optical waveguide gain medium comprising a second plurality of grating structures having the period $\Lambda$ with an offset of $\Lambda/4\pm\Lambda/8$ from the first plurality of grating structures;

wherein the first optical grating comprises one of index-modulated grating structures or loss-modulated grating structures, and the second optical grating comprises the other of the index-modulated grating structures or the loss-modulated grating structures.

11. The method according to claim 10, wherein the step b) includes forming the first plurality of grating structures in a first epitaxial film or layer of a first group III-V semiconductor; and wherein step d) includes forming the second plurality of grating structures in a second epitaxial film or layer of a second group III-V semiconductor.

12. The method according to claim 11, wherein the step b) also comprises:

providing a first electrical contact region between the substrate and the first optical grating; and providing a first spacer region between the optical waveguide gain medium and the first optical grating;

wherein the step d) also comprises:

providing a second spacer region between the optical waveguide gain medium and the second optical grating;

providing a second electrical contact region on the second optical grating; and wherein the method further comprises:

providing a first electrode on the first electrical contact region; and providing a second electrode on the second electrical contact region.

13. The method according to claim 12, wherein the first electrical contact region and the first spacer region are comprised of one of an n-doped group III-V semiconductor or a p-doped group III-V semiconductor; and wherein the second electrical contact region and the second spacer region are comprised of the other of the n-doped group III-V semiconductor or the p-doped group III-V semiconductor.

14. The method according to claim 12, wherein $\eta_{Spacer1}<\eta_{IndexG}<\eta_{wgm}$; $\eta_{wgm}$ is a refractive index of the optical waveguide gain medium, and $\eta_{IndexG}$ is a refractive index of the first optical grating; and wherein $\eta_{Spacer2}<\eta_{wgm}<\eta_{LossG}$; wherein $\eta_{Spacer2}$ is a refractive index of the second spacer region, $\eta_{wgm}$ is the refractive index of the optical waveguide gain medium, and $\eta_{LossG}$ is a refractive index of the second optical grating.

15. The method according to claim 12, wherein the step b) comprises:

depositing the first electrical contact region on the substrate;

depositing a first grating material layer on the first electrical contact region;

depositing a first spacer material layer on the first grating material layer;

etching the first spacer material layer and the first grating material layer to form the first plurality of grating structures; and depositing additional material between the first plurality of grating structures, comprising a same material as the first electrical contact region and the first spacer layer to form the first spacer region;

wherein the step c) comprises:

depositing an optical waveguide gain medium material layer on the first spacer layer;

wherein the step d) comprises:

depositing a second spacer material layer over the optical waveguide gain medium material layer;

depositing a second grating material layer over the second spacer material layer;

depositing a second electrical contact material layer over the second grating material layer;

etching the second spacer material layer, the second grating material layer, and the second electrical contact material layer to form the second plurality of grating structures;

depositing additional material between the second plurality of grating structures, comprising a same material as the second electrical contact material layer and the second spacer material layer to form the second spacer region and the second electrical contact region; and etching at least one of the second electrical contact region, the second spacer region, the optical waveguide gain medium, and the first spacer region into a ridge waveguide.

* * * * *